(12) United States Patent
Lee et al.

(10) Patent No.: US 12,453,082 B2
(45) Date of Patent: Oct. 21, 2025

(54) SEMICONDUCTOR DEVICE HAVING A CELL SEPARATION PATTERN IN CONTACT WITH THE BIT LINE CONTACT

(71) Applicant: SAMSUNG ELECTRONICS CO., LTD., Suwon-si (KR)

(72) Inventors: Kiseok Lee, Suwon-si (KR); Jongmin Kim, Suwon-si (KR); Hyo-Sub Kim, Suwon-si (KR); Hui-Jung Kim, Suwon-si (KR); Sohyun Park, Suwon-si (KR); Junhyeok Ahn, Suwon-si (KR); Chan-Sic Yoon, Suwon-si (KR); Myeong-Dong Lee, Suwon-si (KR); Woojin Jeong, Suwon-si (KR); Wooyoung Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 506 days.

(21) Appl. No.: 18/109,442

(22) Filed: Feb. 14, 2023

(65) Prior Publication Data
US 2023/0422486 A1 Dec. 28, 2023

(30) Foreign Application Priority Data
Jun. 24, 2022 (KR) .................. 10-2022-0077227

(51) Int. Cl.
H10B 12/00 (2023.01)
(52) U.S. Cl.
CPC ......... H10B 12/482 (2023.02); H10B 12/053 (2023.02); H10B 12/34 (2023.02); H10B 12/485 (2023.02)

(58) Field of Classification Search
CPC ...... H10B 12/02; H10B 12/05; H10B 12/053; H10B 12/09; H10B 12/30; H10B 12/315;
(Continued)

(56) References Cited

U.S. PATENT DOCUMENTS 8,969,936 B2 3/2015 Lee et al.
9,230,612 B2 1/2016 Park
(Continued)

FOREIGN PATENT DOCUMENTS

KR 10-2023-0164471 A 12/2023
TW 202224147 B 11/2022

*Primary Examiner* — Hoai V Pham
(74) *Attorney, Agent, or Firm* — Muir Patent Law, PLLC

(57) ABSTRACT

A semiconductor device includes a cell active pattern including a first portion and a second portion that are spaced apart from each other; a gate structure between the first portion and the second portion of the cell active pattern; a bit-line contact on the first portion of the cell active pattern; a connection pattern on the second portion of the cell active pattern; and a cell separation pattern in contact with the bit-line contact and the connection pattern, wherein the cell separation pattern includes a first sidewall in contact with the connection pattern and a second sidewall in contact with the bit-line contact, an upper portion of the second sidewall of the cell separation pattern is in contact with the bit-line contact, and a lower portion of the second sidewall of the cell separation pattern is spaced apart from the bit-line contact.

20 Claims, 47 Drawing Sheets

(58) Field of Classification Search
CPC .... H10B 12/34; H10B 12/482; H10B 12/485; H10B 61/22; H10B 63/10; H10B 63/30
USPC .................................................. 257/906, 908
See application file for complete search history.

(56) References Cited

U.S. PATENT DOCUMENTS

| | | |
|---|---|---|
| 9,276,074 B2 | 3/2016 | Choi et al. |
| 9,379,114 B2 | 6/2016 | Jeong et al. |
| 9,627,387 B2 | 4/2017 | Jung et al. |
| 9,831,172 B2 | 11/2017 | Kim et al. |
| 10,490,444 B2 | 11/2019 | Choi et al. |
| 2021/0193668 A1 | 6/2021 | Feng et al. |
| 2022/0077154 A1 | 3/2022 | Kim et al. |
| 2022/0189966 A1 | 6/2022 | Jang et al. |
| 2022/0384449 A1 | 12/2022 | Kim et al. |
| 2024/0276702 A1* | 8/2024 | Ikeda ................ H10B 12/34 |

* cited by examiner

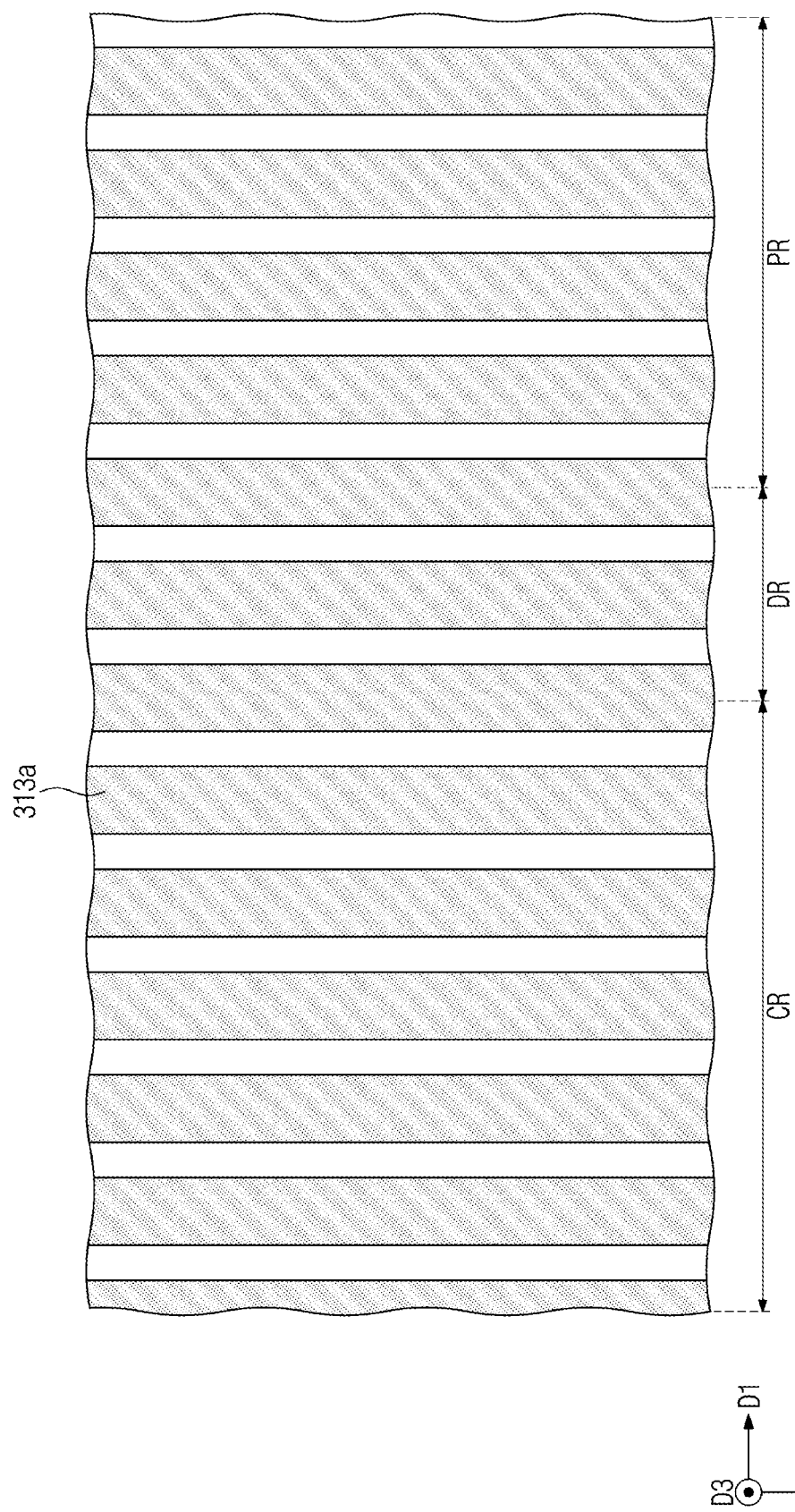

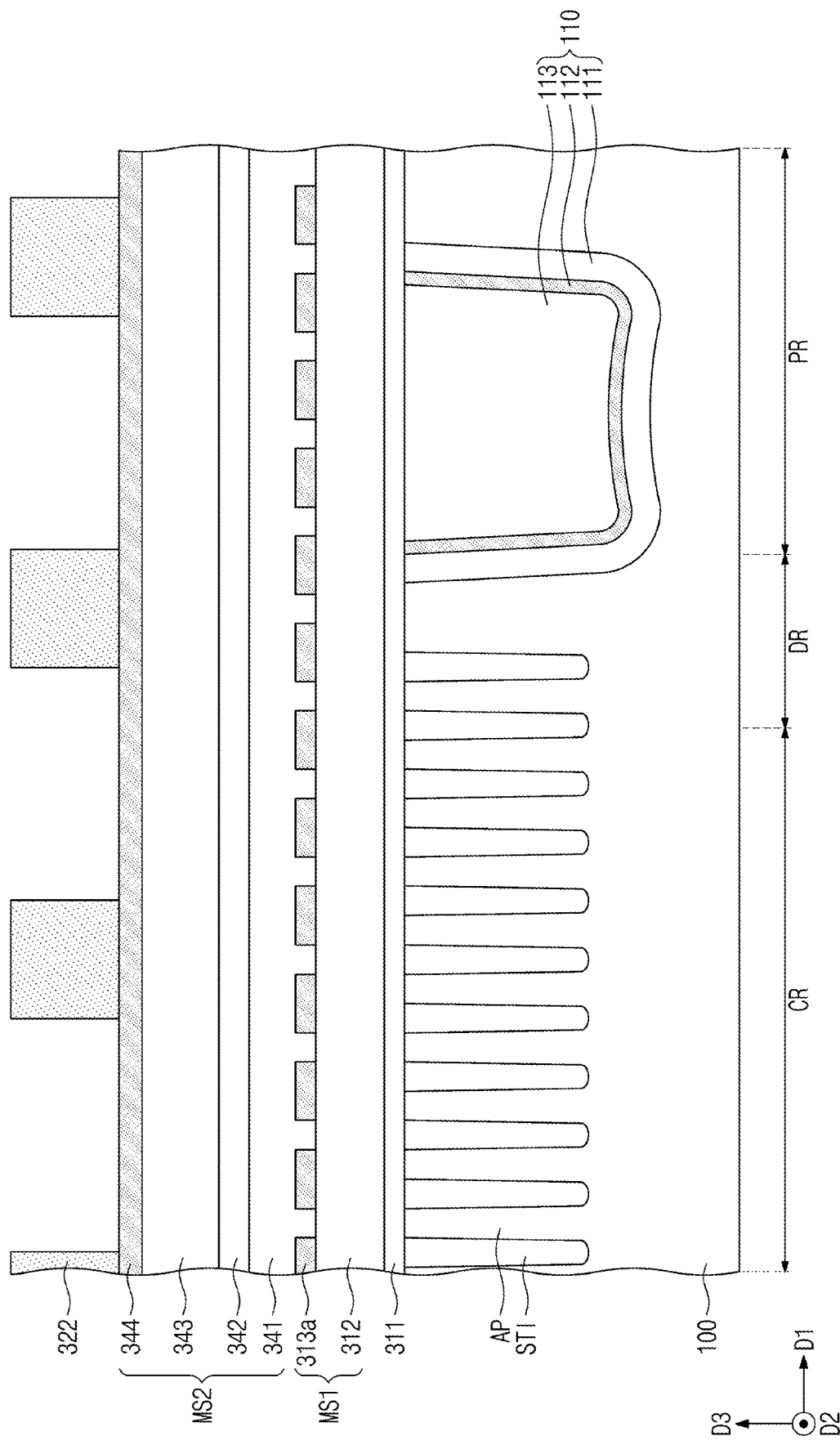

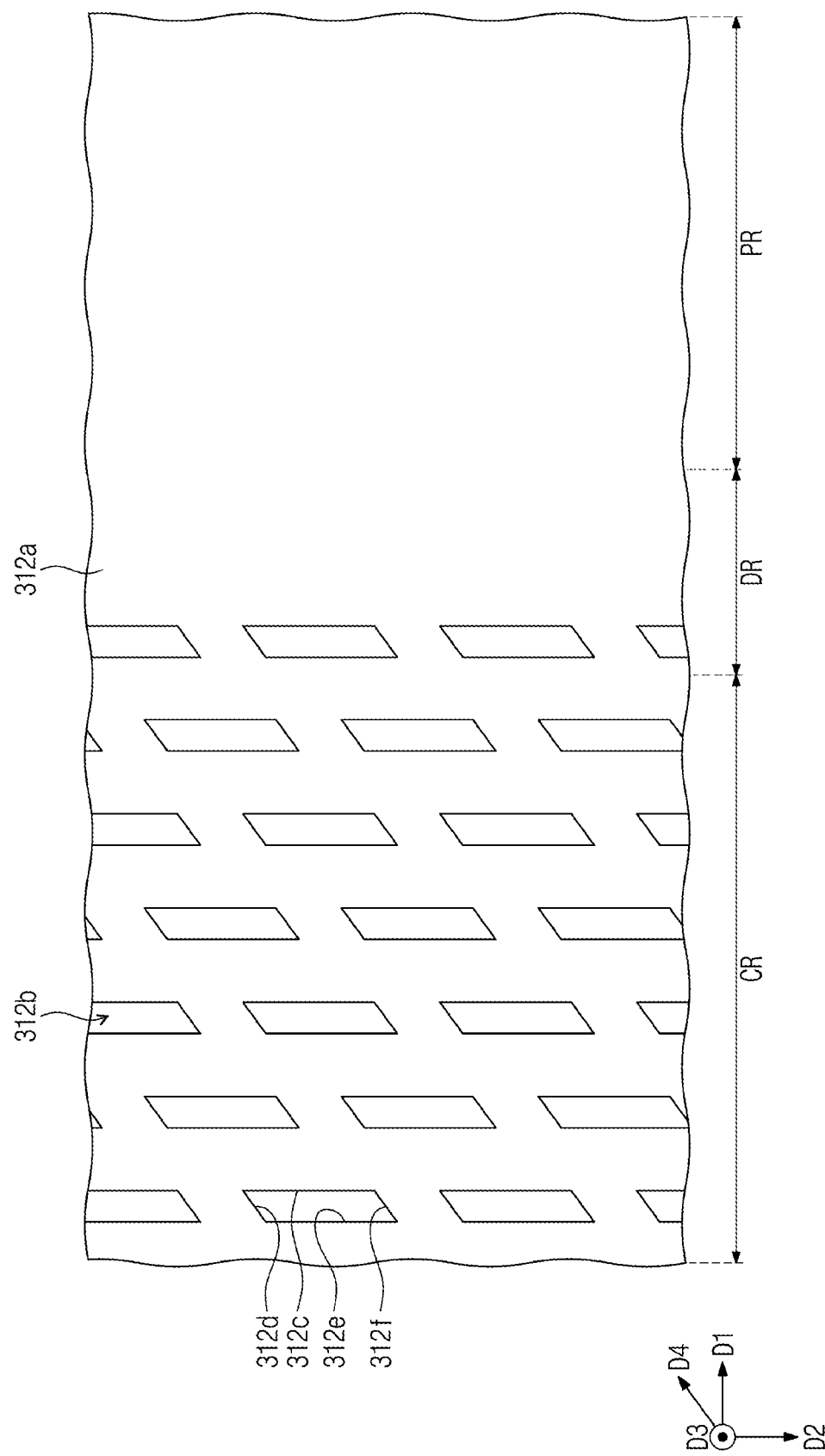

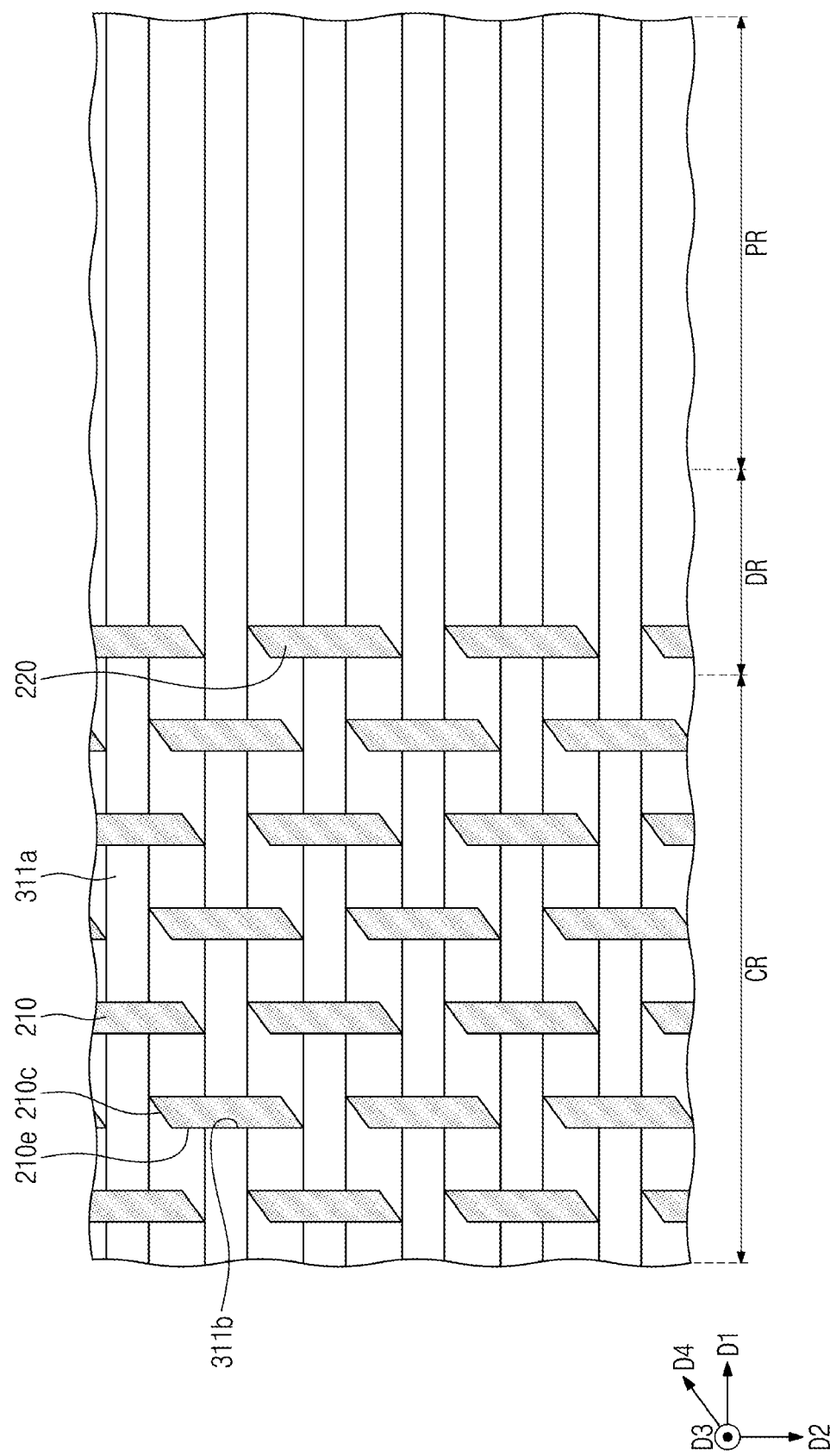

SEMICONDUCTOR DEVICE HAVING A CELL SEPARATION PATTERN IN CONTACT WITH THE BIT LINE CONTACT

CROSS-REFERENCE TO RELATED APPLICATION

This U.S. nonprovisional application claims priority under 35 U.S.C § 119 to Korean Patent Application No. 10-2022-0077227 filed on Jun. 24, 2022 in the Korean Intellectual Property Office, the disclosure of which is hereby incorporated by reference in its entirety.

BACKGROUND

1. Field

Embodiments relate to a semiconductor device and a method of fabricating the same.

2. Description of the Related Art

Semiconductor devices are beneficial in the electronic industry because of their small size, multi-functionality, and/or low fabrication cost. The semiconductor devices may be categorized as any one of semiconductor memory devices storing logic data, semiconductor logic devices processing operations of logic data, and hybrid semiconductor devices having both memory and logic elements.

Recently, with a growing demand for electronic products providing high speed and low consumption, it has become desirable that semiconductor devices embedded in the electronic products should have high operating speed and/or lower operating voltage. The increase in integration of the semiconductor device may induce a reduction in electrical properties and production yield of the semiconductor device. Hence, many studies have been conducted to increase electrical properties and production yield of the semiconductor device.

SUMMARY

The embodiments may be realized by a semiconductor device comprising a cell active pattern including a first portion and a second portion that are spaced apart from each other, a gate structure between the first portion and the second portion of the cell active pattern, a bit-line contact on the first portion of the cell active pattern, a connection pattern on the second portion of the cell active pattern, and a cell separation pattern in contact with the bit-line contact and the connection pattern. The cell separation pattern includes a first sidewall in contact with the connection pattern and a second sidewall in contact with the bit-line contact, an upper portion of the second sidewall of the cell separation pattern is in contact with the bit-line contact, and a lower portion of the second sidewall of the cell separation pattern is spaced apart from the bit-line contact.

The embodiments may be realized by a semiconductor device comprising a cell active pattern including a first portion and a second portion that are spaced apart from each other, a gate structure between the first portion and the second portion of the cell active pattern, a bit-line contact on the first portion of the cell active, a connection pattern on the second portion of the cell active pattern, and a cell separation pattern in contact with the bit-line contact and the connection pattern, wherein a lowermost portion of the bit-line contact is at a level higher than a level of a lowermost portion of the cell separation pattern.

The embodiments may be realized by providing a semiconductor device comprising a substrate that includes a cell region, a dummy region, and a cell active pattern on the cell region, the cell active pattern including a first portion and a second portion that are spaced apart from each other, a gate structure between the first portion and the second portion of the cell active pattern, a bit-line contact on the first portion of the cell active pattern, a connection pattern on the second portion of the cell active pattern, a cell separation pattern over the cell region and in contact with the bit-line contact and the connection pattern, and a dummy separation pattern over the dummy region and spaced apart from the bit-line contact, wherein the cell separation pattern includes a first sidewall in contact with the connection pattern and a second sidewall in contact with the bit-line contact, the dummy separation pattern includes a first sidewall parallel to the first sidewall of the cell separation pattern and a second sidewall connected to the first sidewall of the dummy separation pattern, the second sidewall of the cell separation pattern is curved, and the second sidewall of the dummy separation pattern is flat.

The embodiments may be realized by providing a method of fabricating a semiconductor device, the method comprising forming an active pattern on a substrate, forming on the active pattern a preliminary line that extends in a first direction, forming a mask structure on the preliminary line, etching the mask structure to form an exposed opening that exposes the preliminary line, using the exposed opening to etch the preliminary line to form a separation opening, and forming a separation pattern in the separation opening, wherein the exposed opening includes a first sidewall, a second sidewall, and a third sidewall that connects the first sidewall to the second sidewall, the first and second sidewalls being opposite to each other, and wherein an angle between the first and third sidewalls of the exposed opening is greater than an angle between the second and third sidewalls of the exposed opening

BRIEF DESCRIPTION OF THE DRAWINGS

Features will be apparent to those of skill in the art by describing in detail exemplary embodiments with reference to the attached drawings in which:

FIGS. 2A, 2B, 3A, 3B, 4A, 4B, 5A, 5B, 6A, 6B, 7A, 7B, 8, 9A, 9B, 10A, 10B, 11A, 11B, 12, 13, 14, 15, 16, 17, 18, 19A, 19B, 20A, 20B, 20C, 21, 22, 23, 24, 25, 26, and 27 illustrate diagrams showing stages in a method of fabricating the semiconductor device depicted in FIGS. 1A to 1H.

DETAILED DESCRIPTION

The following will describe in detail a semiconductor device and its fabrication method according to some implementations with reference to the accompanying drawings.

Figure 1A:
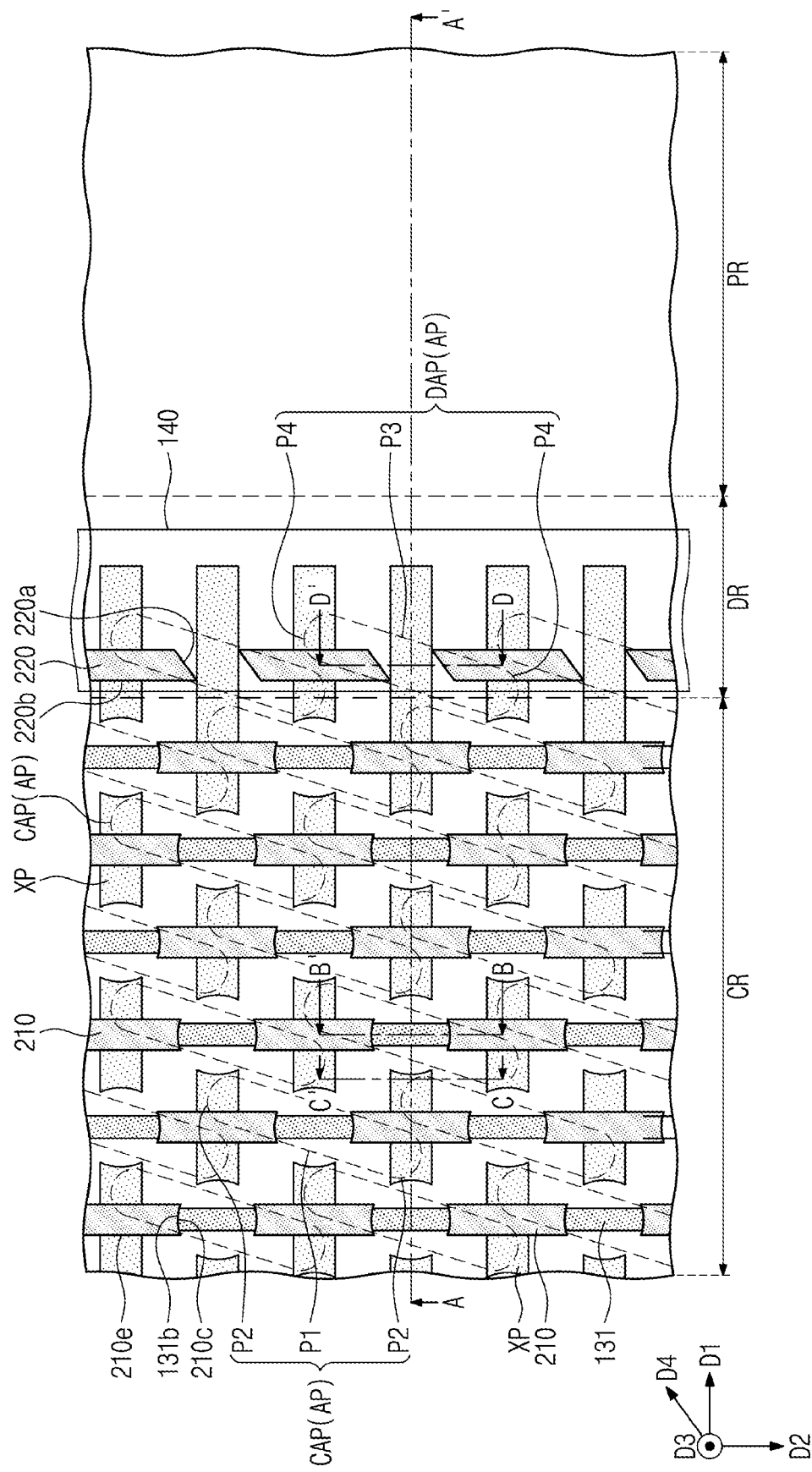
FIG. 1A illustrates a plan view showing a semiconductor device according to some embodiments.
Figure 1B:
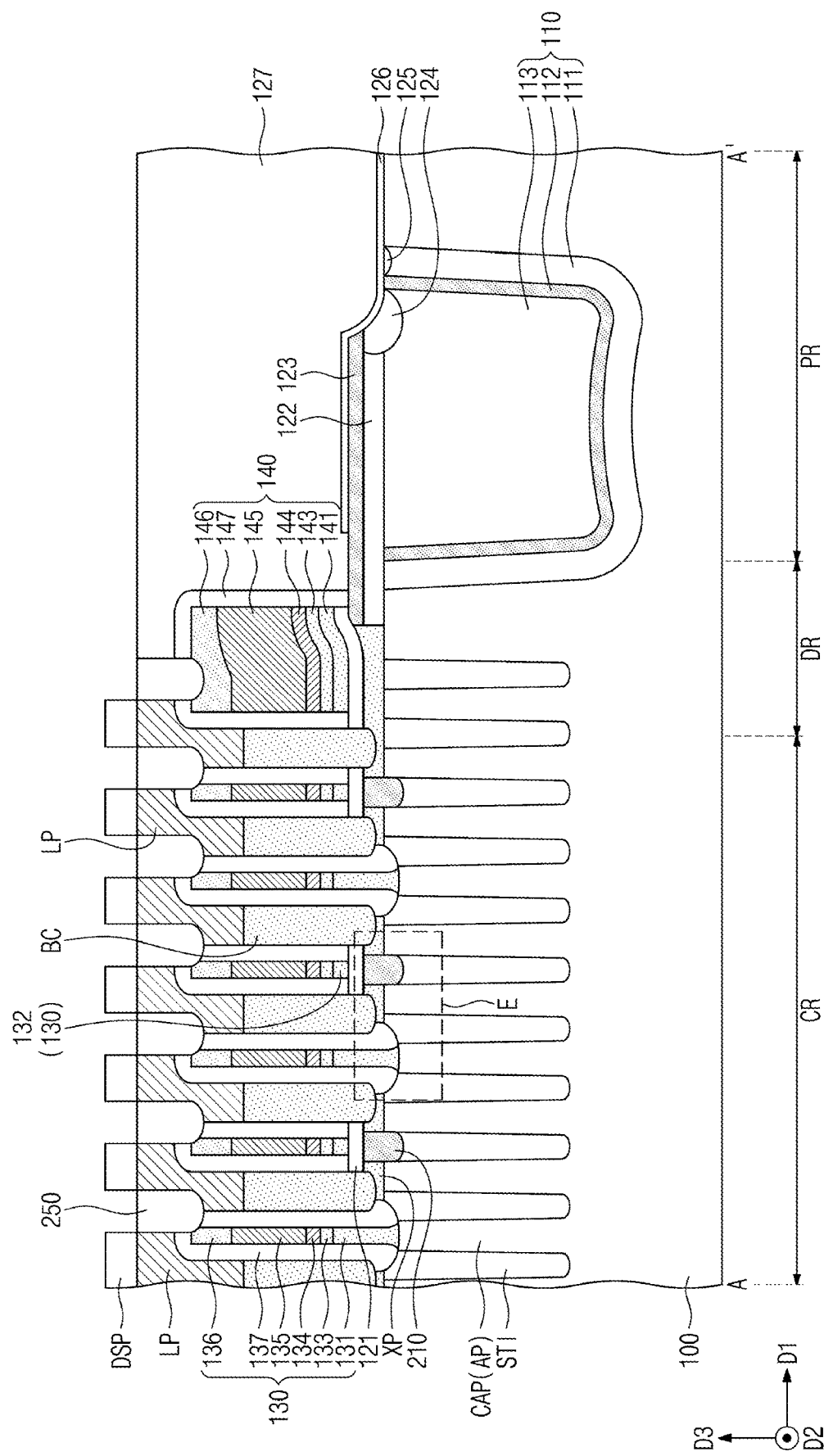
FIG. 1B illustrates a cross-sectional view taken along line A-A' of FIG. 1A.
Figure 1C:
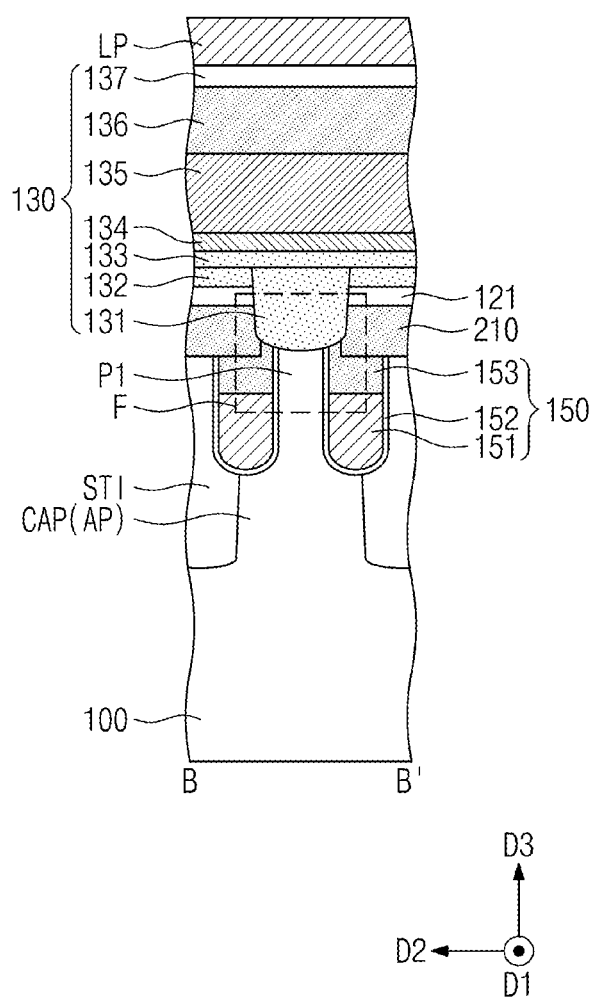
FIG. 1C illustrates a cross-sectional view taken along line B-B' of FIG. 1A.
Figure 1D:
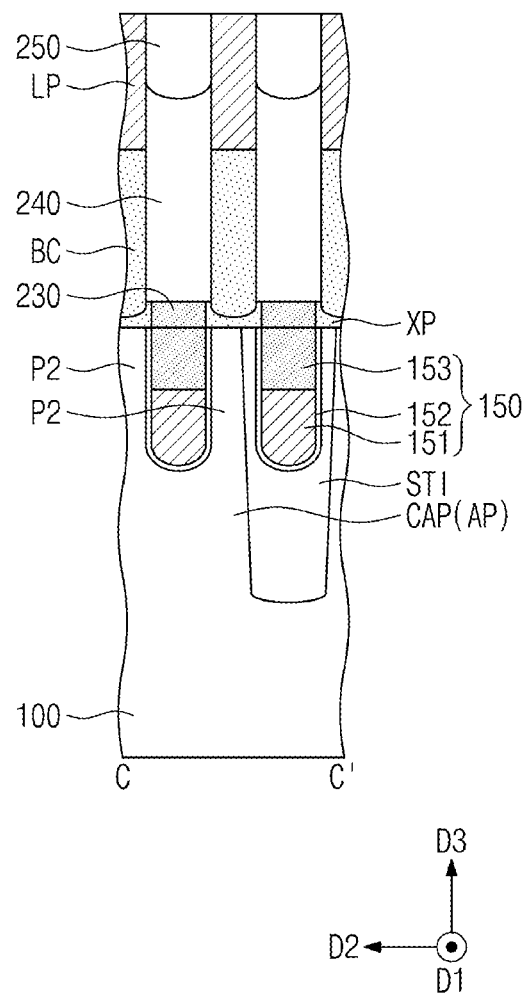
FIG. 1D illustrates a cross-sectional view taken along line C-C' of FIG. 1A.
Figure 1E:
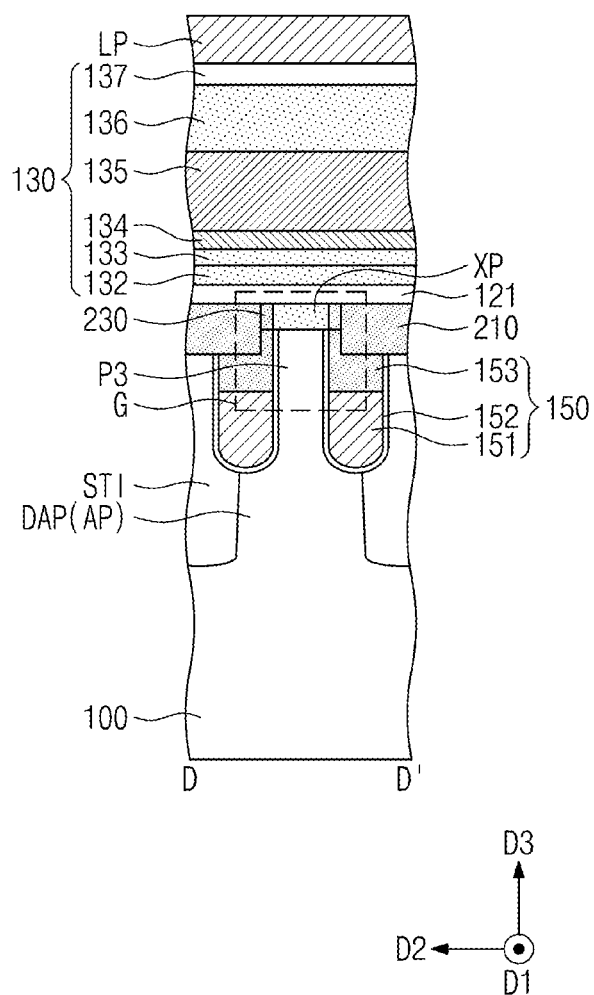
FIG. 1E illustrates a cross-sectional view taken along line D-D' of FIG. 1A.
Figure 1F:
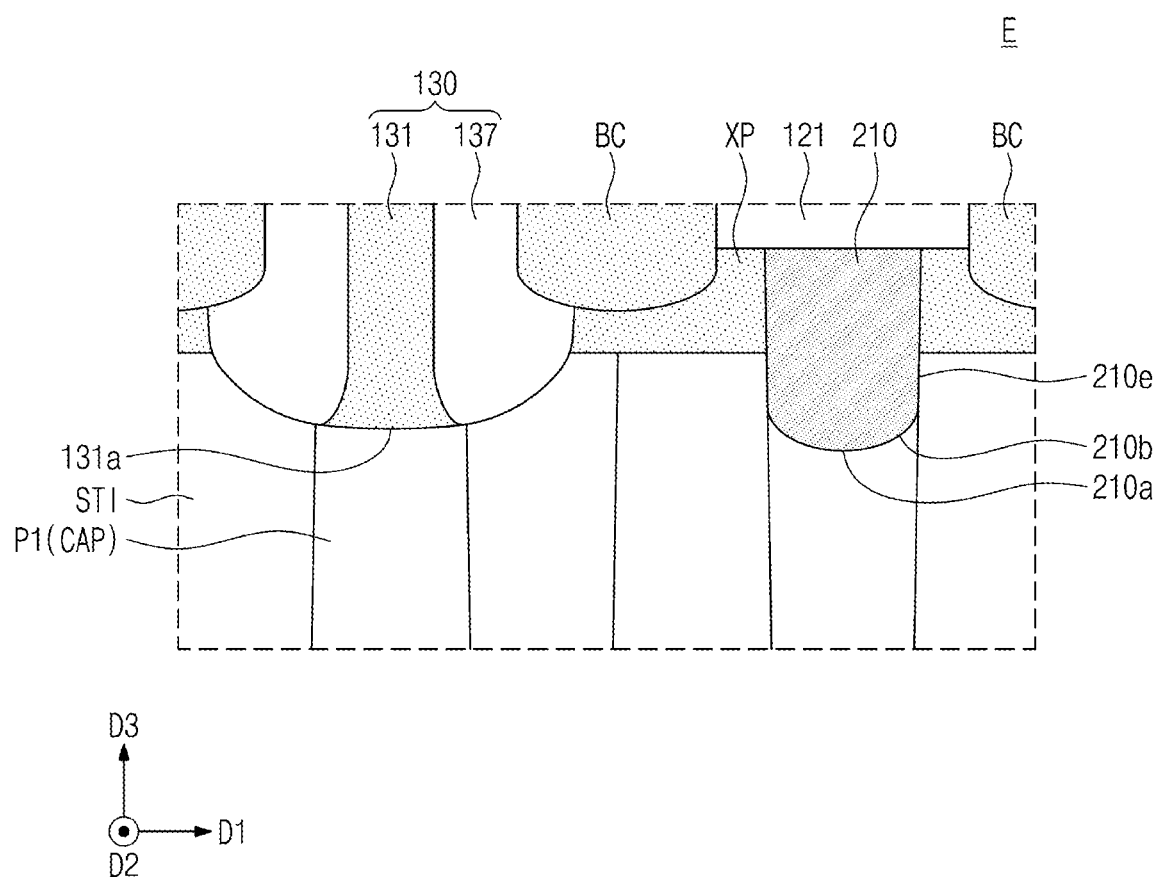
FIG. 1F illustrates an enlarged view showing section E of FIG. 1B.
Figure 1G:
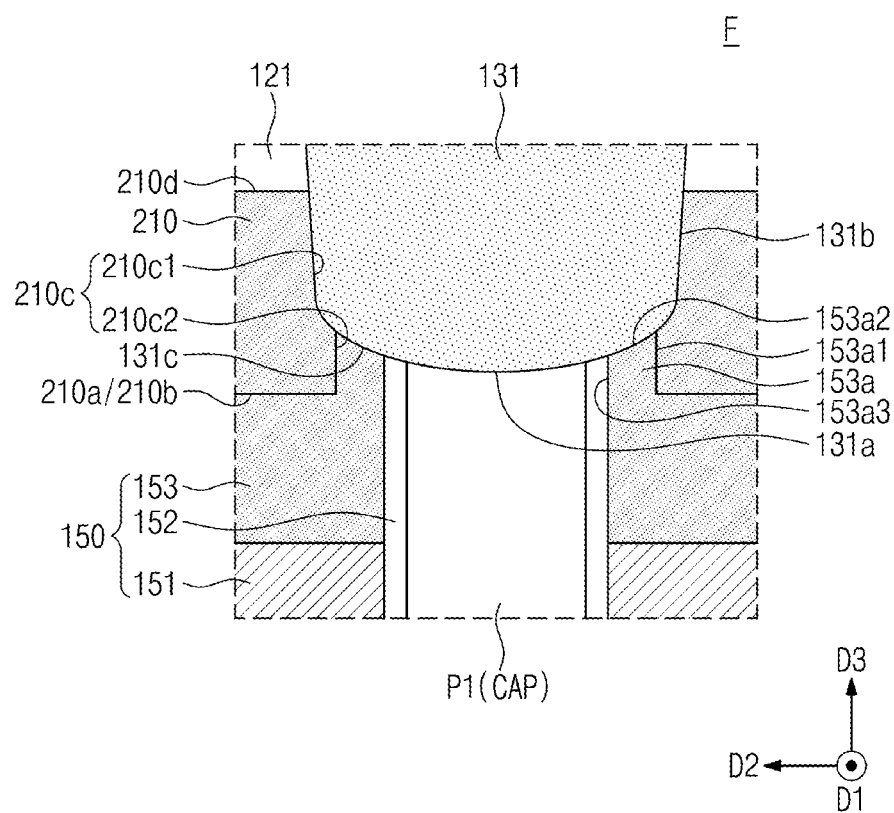
FIG. 1G illustrates an enlarged view showing section F of FIG. 1C.
Figure 1H:
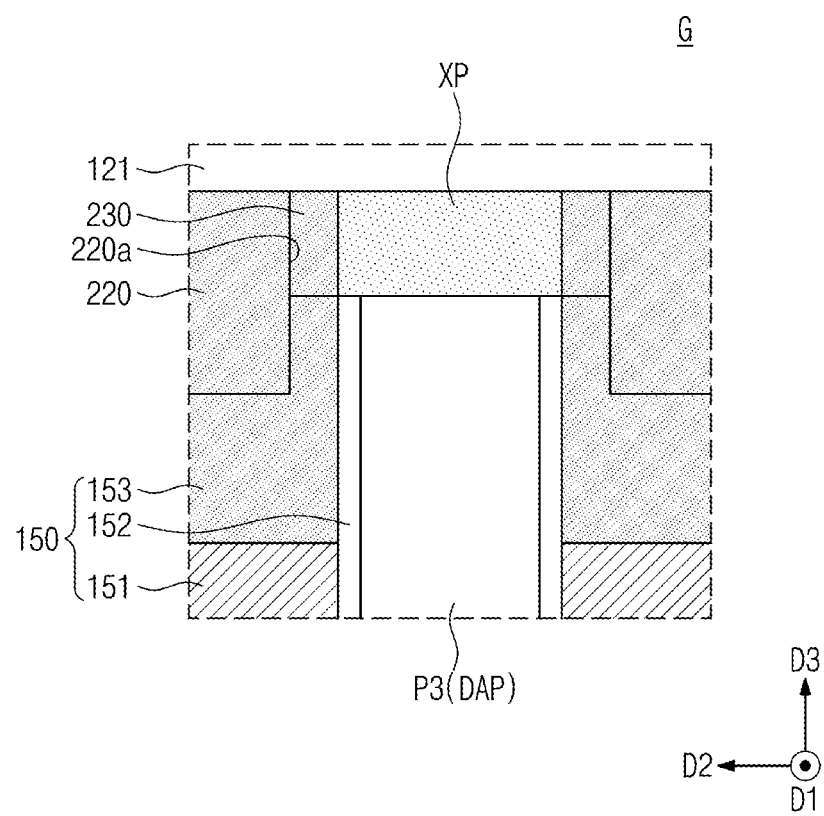
FIG. 1H illustrates an enlarged view showing section G of FIG. 1E.

FIG. 1A illustrates a plan view showing a semiconductor device according to some embodiments. FIG. 1B illustrates a cross-sectional view taken along line A-A' of FIG. 1A. FIG. 1C illustrates a cross-sectional view taken along line B-B' of FIG. 1A. FIG. 1D illustrates a cross-sectional view taken along line C-C' of FIG. 1A. FIG. 1E illustrates a cross-sectional view taken along line D-D' of FIG. 1A. FIG. 1F illustrates an enlarged view showing section E of FIG. 1B. FIG. 1G illustrates an enlarged view showing section F of FIG. 1C. FIG. 1H illustrates an enlarged view showing section G of FIG. 1E.

Referring to FIGS. 1A, 1B, 1C, 1D, and 1E, a semiconductor device may include a substrate 100. In some implementations, the substrate 100 may be a semiconductor substrate. For example, the substrate 100 may include silicon, germanium, silicon-germanium, GaP, or GaAs. In some implementations, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

The substrate 100 may include a cell region CR, a dummy region DR, and a peripheral region PR. The cell region CR, the dummy region DR, and the peripheral region PR may be areas that can be divided in a planar fashion in the first and second directions D1 and D2. The peripheral region PR may surround the cell region CR. The dummy region DR may be disposed between the cell region CR and the peripheral region PR.

The substrate 100 may include active patterns AP. The substrate 100 may have upper portions that protrude in a third direction D3. The upper portions of the substrate 100 may be defined as the active patterns AP. The active patterns AP may be spaced apart from each other.

The active patterns AP may include cell active patterns CAP and dummy active patterns DAP. The cell active patterns CAP may be provided on the cell region CR. The dummy active patterns DAP may be provided on the dummy region DR.

A device isolation layer STI may be provided in a space between the active patterns AP. The device isolation layer STI may be provided in the substrate 100. The active patterns AP may be defined by the device isolation layer STI. Each of the active patterns AP may be surrounded by the device isolation layer STI. The device isolation layer STI may include a dielectric material. For example, the device isolation layer STI may include an oxide.

A dielectric structure 110 may be provided in the substrate 100. The dielectric structure 110 may be provided on the dummy and peripheral regions DR and PR of the substrate 100. The dielectric structure 110 may include a first layer 111, a second layer 112 on the first layer 111, and a third layer 113 on the second layer 112. The first, second, and third layers 111, 112, and 113 of the dielectric structure 110 may include a dielectric material. For example, the first and third layers 111 and 113 may include an oxide, and the second layer 112 may include a nitride. In some embodiments, the number of layers included in the dielectric structure 110 may be greater or less than that shown.

Gate structures 150 that extend in the first direction D1 may be provided. The gate structures 150 may be arranged in the second direction D2. The gate structure 150 may be provided on the device isolation layer STI and the active patterns AP. The gate structure 150 may be a buried gate structure that is buried in the active patterns AP and the device isolation layer STI. The active patterns AP may include impurity regions. The gate structure 150 and the active pattern AP may define a cell transistor.

The gate structure 150 may include a gate dielectric layer 152 on the active pattern AP, a gate electrode 151 on the gate dielectric layer 152, and a gate capping layer 153 on the gate electrode 151. The gate dielectric layer 152 and the gate capping layer 153 may include a dielectric material. For example, the gate dielectric layer 152 may include an oxide, and the gate capping layer 153 may include a nitride. The gate electrode 151 may include a conductive material.

The cell active pattern CAP may include a first portion P1 and two second portions P2. The first portion P1 of the cell active pattern CAP may be disposed between the two second portions P2 of the cell active pattern CAP. The gate structure 150 may be provided between the first portion P1 and the second portion P2 of the cell active pattern CAP. The gate structure 150 may divide the first and second portions P1 and P2 of the cell active pattern CAP from each other.

The dummy active pattern DAP may include a first portion P3 and two second portions P4. The first portion P3 of the dummy active pattern DAP may be disposed between the two second portions P4 of the dummy active pattern DAP. The gate structure 150 may be provided between the first and second portions P3 and P4 of the dummy active pattern DAP. The gate structure 150 may divide the first and second portions P3 and P4 of the dummy active pattern DAP from each other.

Connection patterns XP may be provided on the active patterns AP. The connection patterns XP may include connection patterns XP provided on or over the cell region CR, connection patterns XP provided on or over the dummy region DR, and connection patterns XP that extend from the cell region CR onto the dummy region DR. Each of the connection patterns XP, which are provided on the cell region CR, may be provided on the second portion P2 of the cell active pattern CAP. Each of the connection patterns XP, which are provided on the dummy region DR, may be provided on the second portion P4 of the dummy active pattern DAP. Each of the connection patterns XP that extend from the cell region CR onto the dummy region DR may extend from the second portion P2 of the cell active pattern CAP onto the first portion P1 of the dummy active pattern DAP. The connection pattern XP may include a conductive material. For example, the connection pattern XP may include polysilicon.

Referring to FIG. 1D, dielectric lines 230 may be provided which extend in the first direction D1. The dielectric lines 230 may be arranged in the second direction D2. The connection pattern XP may be disposed between two dielectric lines 230 that are adjacent to each other in the second direction D2. The dielectric line 230 may be provided on the gate structure 150. The dielectric line 230 may include a dielectric material. For example, the dielectric line 230 may include a nitride. In some embodiments, the dielectric line 230 and the gate capping layer 153 may be connected into a single unitary body with no boundary therebetween.

Separation patterns may be provided. The separation patterns may include cell separation patterns 210 disposed over the cell region CR and dummy separation patterns 220 disposed over the dummy region DR. Each of the cell separation patterns 210 and dummy separation patterns 220 may be provided between two connection patterns XP that are adjacent to each other in the first direction D1. Two connection patterns XP that are adjacent to each other in the first direction D1 may be separated from each other in the first direction D1 by the cell separation pattern 210 or the dummy separation pattern 220.

Each of the cell and dummy separation patterns 210 and 220 may be provided on the device isolation layer STI and the gate structure 150. Two cell separation patterns 210 adjacent to each other in the second direction D2 may be provided therebetween with the first portion P1 of the cell active pattern CAP and a bit-line contact 131, as will be discussed below. Two dummy separation patterns 220 adjacent to each other in the second direction D2 may be provided therebetween with the connection pattern XP and the first portion P3 of the dummy active pattern DAP. The cell and dummy separation patterns 210 and 220 may include a dielectric material. For example, the cell and dummy separation patterns 210 and 220 may include a nitride.

A first oxide pattern 124 may be provided on the third layer 113 of the dielectric structure 110. A second oxide pattern 125 may be provided on the first layer 111 of the dielectric structure 110. A first dielectric layer 122 may be provided on the dielectric structure 110. A second dielectric layer 123 may be provided on the first dielectric layer 122. A third dielectric layer 126 may be provided on the second dielectric layer 123, the first oxide pattern 124, and the second oxide pattern 125. The first, second, and third dielectric layers 122, 123, and 126 may include a dielectric material. For example, the first and third dielectric layers 122 and 126 may include an oxide, and the second dielectric layer 123 may include a nitride.

A dielectric pattern 121 may be provided on the cell separation patterns 210, the dummy separation patterns 220, and the connection patterns XP. The dielectric pattern 121 may include a dielectric material. In some embodiments, the dielectric pattern 121 may include a plurality of dielectric layers.

Bit-line structures 130 that extend in the second direction D2 may be provided. The bit-line structures 130 may be arranged in the first direction D1. The bit-line structures 130 may be provided over the cell region CR. The bit-line structures 130 may be provided on the dielectric pattern 121 and the cell active pattern CAP. The bit-line structure 130 may be electrically connected to the active pattern AP.

Each of the bit-line structures 130 may include bit-line contacts 131, first conductive layers 132, a second conductive layer 133, a third conductive layer 134, a fourth conductive layer 135, a bit-line capping layer 136, and a bit-line spacer 137.

The bit-line contacts 131 of the bit-line structure 130 may be arranged in the second direction D2. The first conductive layers 132 of the bit-line structure 130 may be arranged in the second direction D2. The bit-line contacts 131 and the first conductive layers 132 of the bit-line structure 130 may be disposed alternately with each other along the second direction D2. The bit-line contact 131 may be disposed on the first portion P1 of the cell active pattern CAP. The bit-line contact 131 may penetrate the dielectric pattern 121. The first conductive layer 132 may be provided on the dielectric pattern 121. The bit-line contact 131 and the first conductive layer 132 may include a conductive material. For example, the bit-line contact 131 and the first conductive layer 132 may include polysilicon. In some embodiments, the bit-line contacts 131 and the first conductive layers 132 included in one bit-line structure 130 may be connected into a single unitary body with no boundary therebetween.

The second conductive layer 133 may be provided on the bit-line contacts 131 and the first conductive layers 132. The third conductive layer 134 may be provided on the second conductive layer 133. The fourth conductive layer 135 may be provided on the third conductive layer 134. The bit-line capping layer 136 may be provided on the fourth conductive layer 135. The second, third, and fourth conductive layers 133, 134, and 135 may include a conductive material. For example, the second conductive layer 133 may include polysilicon, and the third and fourth conductive layers 134 and 135 may include a metal. The bit-line capping layer 136 may include a dielectric material. For example, the bit-line capping layer 136 may include a nitride. In some embodiments, the number of conductive layers included in one bit-line structure 130 may be greater or less than that shown.

The bit-line spacer 137 may cover a top surface and a sidewall of the bit-line capping layer 136, sidewalls of the first, second, third, and fourth conductive layers 132, 133, 134, and 135, and sidewalls of the bit-line contacts 131. The bit-line spacer 137 may include a dielectric material. In some embodiments, the bit-line spacer 137 may include a plurality of dielectric layers.

Dummy line structures 140 that extend in the second direction D2 may be provided. The dummy line structure 140 may be located over the dummy region DR. The dummy line structure 140 may be located on the dielectric pattern 121. The dummy separation pattern 220 may be disposed closer than the cell separation pattern 210 to the dummy line structure 140. The dummy line structure 140 may include a first dummy conductive layer 141 on the dielectric pattern 121, a second dummy conductive layer 143 on the first dummy conductive layer 141, a third dummy conductive layer 144 on the second dummy conductive layer 143, a fourth dummy conductive layer 145 on the third dummy conductive layer 144, a dummy capping layer 146 on the fourth dummy conductive layer 145, and a dummy spacer 147.

The first, second, third, and fourth dummy conductive layers 141, 143, 144, and 145 may include a conductive material. For example, the first and second dummy conductive layers 141 and 143 may include polysilicon, and the third and fourth dummy conductive layers 144 and 145 may include a metal. The dummy capping layer 146 may include a dielectric material. For example, the dummy capping layer 146 may include a nitride. In some embodiments, the number of conductive layers included in the dummy line structure 140 may be greater or less than that shown.

The dummy spacer 147 may cover a top surface and a sidewall of the dummy capping layer 146 and sidewalls of the first, second, third, and fourth dummy conductive layers 141, 143, 144, and 145. The dummy spacer 147 may include a dielectric material.

Buried contacts BC may be provided may be provided on corresponding connection patterns XP. The buried contacts BC may be provided between neighboring bit-line structures 130. The buried contacts BC may include a conductive material. For example, the buried contacts BC may include polysilicon.

Landing pads LP may be provided on the buried contacts BC. The landing pads LP may include a conductive material. For example, the landing pads LP may include metal. In some embodiments, a metal silicide layer and a barrier layer may be provided between the buried contact BC and the landing pad LP.

Dielectric fences 240 may be provided on the dielectric line 230. The dielectric fences 240 may be provided between buried contacts BC that are adjacent to each other in the second direction D2. The dielectric fences 240 may include a dielectric material. A filling pattern 250 may be provided on the dielectric fences 240. The filling pattern 250 may separate the landing pads LP from each other. The filling pattern 250 may include a dielectric material.

A fourth dielectric layer 127 may be provided on the dummy line structure 140 and the third dielectric layer 126. The fourth dielectric layer 127 may be provided over the dummy region DR and the peripheral region PR. The fourth dielectric layer 127 may include a dielectric material. In some embodiments, the fourth dielectric layer 127 may include a plurality of dielectric layers.

Data storage patterns DSP may be provided. The data storage pattern DSP may be electrically connected through the landing pad LP, the buried contact BC, and the connection pattern XP to the second portion P2 of the cell active pattern CAP. In some embodiments, each of the data storage patterns DSP may be in a form of a capacitor that includes a bottom electrode, a dielectric layer, and a top electrode. In this case, a semiconductor device including the data storage patterns DSP may be a dynamic random access memory (DRAM). In some embodiments, each of the data storage patterns DSP may include a magnetic tunnel junction pattern. In this case, a semiconductor device including the data storage patterns DSP may be in a form of a magnetic random access memory (MRAM). In some embodiments, the data storage patterns DSP may include a phase change material or a variable resistance material. In this case, a semiconductor device including the data storage patterns may be in a form of a phase change random access memory (PRAM) or a resistive random access memory (ReRAM). In some embodiments, each of the data storage patterns DSP may include various structures and materials capable of storing data.

Referring to FIGS. 1A, 1F, and 1G, a lowermost portion 131a of the bit-line contact 131 may be located at a higher level than that of a lowermost portion 210a of the cell separation pattern 210. The lowermost portion 210a of the cell separation pattern 210 may be a lowermost portion of a bottom surface 210b of the cell separation pattern 210. An uppermost portion of the first portion P1 of the cell active pattern CAP may be located at a higher level than that of the lowermost portion 210a of the cell separation pattern 210.

The cell separation pattern 210 may include two first sidewalls 210e and two second sidewalls 210c. The first sidewall 210e and the second sidewall 210c of the cell separation pattern 210 may be connected to each other. The first sidewalls 210e of the cell separation pattern 210 may be parallel to the second direction D2. The cell separation pattern 210 may be flat at the first sidewalls 210e. For example, when viewed in plan as shown in FIGS. 1A and 1n cross section as shown in FIG. 1F, the cell separation pattern 210 may be flat at the first sidewalls 210e. The first sidewall 210e of the cell separation pattern 210 may be in contact with the connection pattern XP. The first sidewall 210e of the cell separation pattern 210 may be in contact with the dielectric line 230.

The second sidewall 210c of the cell separation pattern 210 may be in contact with the bit-line contact 131 and the gate capping layer 153 of the gate structure 150. The second sidewall 210c of the cell separation pattern 210 may have an upper portion 210c1 in contact with the bit-line contact 131. The second sidewall 210c of the cell separation pattern 210 may have a lower portion 210c2 in contact with the gate capping layer 153. The lower portion 210c2 of the second sidewall 210c of the cell separation pattern 210 may be spaced apart from the bit-line contact 131.

The cell separation pattern 210 may be curved at the upper portion 210c1 of the second sidewall 210c. For example, when viewed in plan as shown in FIGS. 1A and 1n cross section as shown in FIG. 1G, the cell separation pattern 210 may be curved at the upper portion 210c1 of the second sidewall 210c. The cell separation pattern 210 may be flat at the lower portion 210c2 of the second sidewall 210c. For example, when viewed in cross section as shown in FIG. 1G, the cell separation pattern 210 may be flat at the lower portion 210c1 of the second sidewall 210c.

The lower portion 210c2 of the second sidewall 210c of the cell separation pattern 210 may be parallel to a fourth direction D4. The fourth direction D4 may intersect the first direction D1, the second direction D2, and the third direction D3. For example, the fourth direction D4 may intersect the first and second directions D1 and D2, and may be perpendicular to the third direction D3.

The cell separation pattern 210 may be configured such that the upper and lower portions 210c1 and 210c2 of the second sidewall 210c are connected to each other. The upper portion 210c1 of the second sidewall 210c of the cell separation pattern 210 may be connected to a top surface 210d of the cell separation pattern 210. The lower portion 210c2 of the second sidewall 210c of the cell separation pattern 210 may be connected to a bottom surface 210b of the cell separation pattern 210. The second sidewall 210c of the cell separation pattern 210 may connect the top and bottom surfaces 210d and 210b of the cell separation pattern 210 to each other.

The bit-line contact 131 may include a first contact surface 131b in contact with the upper portion 210c1 of the second sidewall 210c of the cell separation pattern 210. The bit-line contact 131 may include a second contact surface 131c in contact with the gate capping layer 153. The first and second contact surfaces 131b and 131c of the bit-line contact 131 may be connected to each other. The second contact surface 131c of the bit-line contact 131 may be spaced apart from the lower portion 210c2 of the second sidewall 210c of the cell separation pattern 210.

The gate capping layer 153 may include an intervention 153a interposed between the gate dielectric layer 152 and the lower portion 210c2 of the second sidewall 210c of the cell separation pattern 210. At least a part of the intervention 153a of the gate capping layer 153 may be located between the second contact surface 131c of the bit-line contact 131 and the lower portion 210c2 of the second sidewall 210c of the cell separation pattern 210.

The intervention 153a of the gate capping layer 153 may include a first sidewall 153a1 in contact with the lower portion 210c2 of the second sidewall 210c of the cell separation pattern 210, a second sidewall 153a3 in contact with the gate dielectric layer 152, and a top surface 153a2 in contact with the second contact surface 131c of the bit-line contact 131. The top surface 153a2 of the intervention 153a of the gate capping layer 153 may connect to each other the first and second sidewalls 153a1 and 153a3 of the intervention 153a of the gate capping layer 153 to each other.

Referring to FIGS. 1A and 1H, the dummy separation pattern 220 may include two first sidewalls 220b and two second sidewalls 220a. The first sidewall 220b and the second sidewalls 220a of the dummy separation pattern 220 may be connected to each other. The first sidewalls 220b of the dummy separation pattern 220 may be parallel to the second direction D2. The first sidewalls 220b of the dummy separation pattern 220 may be parallel to the first sidewalls 210e of the cell separation pattern 210.

The dummy separation pattern 220 may be flat at the first sidewalls 220b thereof. For example, the dummy separation pattern 220 may be flat at the first sidewalls 220b when viewed in plan as shown in FIG. 1A. The first sidewall 220b of the dummy separation pattern 220 may be in contact with the connection pattern XP. The first sidewall 220b of the dummy separation pattern 220 may be in contact with the dielectric line 230.

The second sidewalls 220a of the dummy separation pattern 220 may be parallel to the fourth direction D4. The second sidewalls 220a of the dummy separation pattern 220 may be parallel to the lower portion 210c2 of the second sidewall 210c of the cell separation pattern 210. The dummy separation pattern 220 may be spaced apart from the bit-line contact 131 of the bit-line structure 130. The second sidewall 220a of the dummy separation pattern 220 may be in contact with the gate capping layer 153 and the dielectric line 230. The second sidewall 220a of the dummy separation pattern 220 may have an upper portion in contact with the dielectric line 230. The second sidewall 220a of the dummy separation pattern 220 may have a lower portion in contact with the gate capping layer 153.

The dummy separation pattern 220 may be flat at the second sidewalls 220a thereof. For example, the dummy separation pattern 220 may be flat at the second sidewalls 220a when viewed in plan as shown in FIGS. 1A and 1n cross section as shown in FIG. 1H.

For a semiconductor device according to some embodiments, as the cell separation patterns 210 are spaced apart from each other in the second direction D2, the lowermost portion 131a of the bit-line contact 131 may be located at a higher level than that of a lowermost portion of the cell separation pattern 210. Therefore, a relatively large distance may be provided between the bit-line contact 131 and the gate electrode 151, and the semiconductor device may have improved electrical properties.

FIGS. 2A, 2B, 3A, 3B, 4A, 4B, 5A, 5B, 6A, 6B, 7A, 7B, 8, 9A, 9B, 10A, 10B, 11A, 11B, 12, 13, 14, 15, 16, 17, 18, 19A, 19B, 20A, 20B, 20C, 21, 22, 23, 24, 25, 26, and 27 illustrate diagrams showing a method of fabricating the semiconductor device depicted in FIGS. 1A to 1H. FIGS. 2A, 3A, 4A, 5A, 6A, 7A, 9A, 10A, 11A, 19A, and illustrate plan views that correspond to FIG. 1A. FIGS. 2B, 3B, 4B, 5B, 6B, 7B, 8B, 9B, 10B, 11B, 12, 13, 14, 15, 16, 17, 18, 19B, 20B, 21, 22, 23, 24, and 25 illustrate cross-sectional views that correspond to FIG. 1B. FIG. 20C illustrates a cross-sectional view that corresponds to FIG. 1C.

Figure 2A:
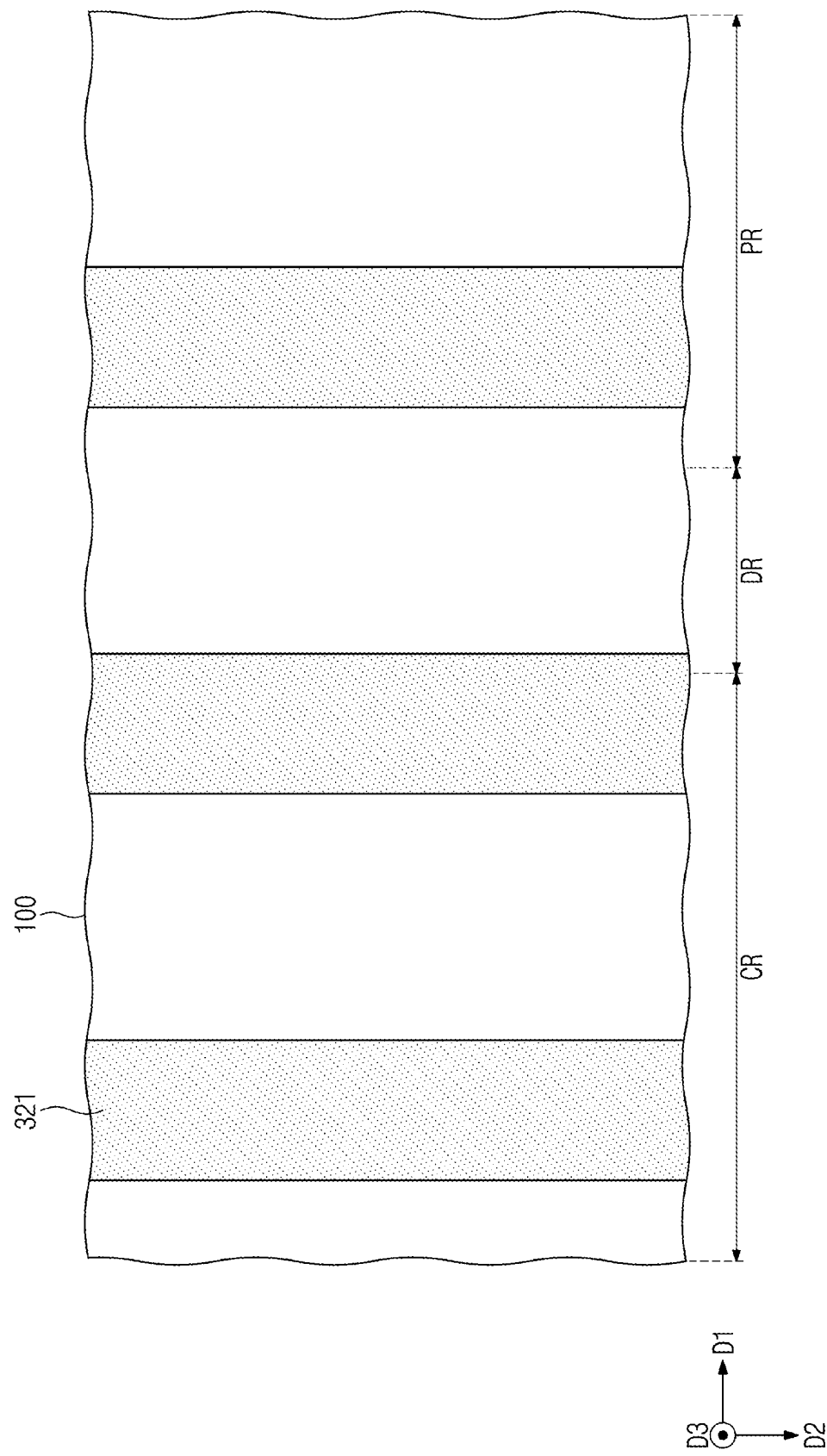
Figure 2B:
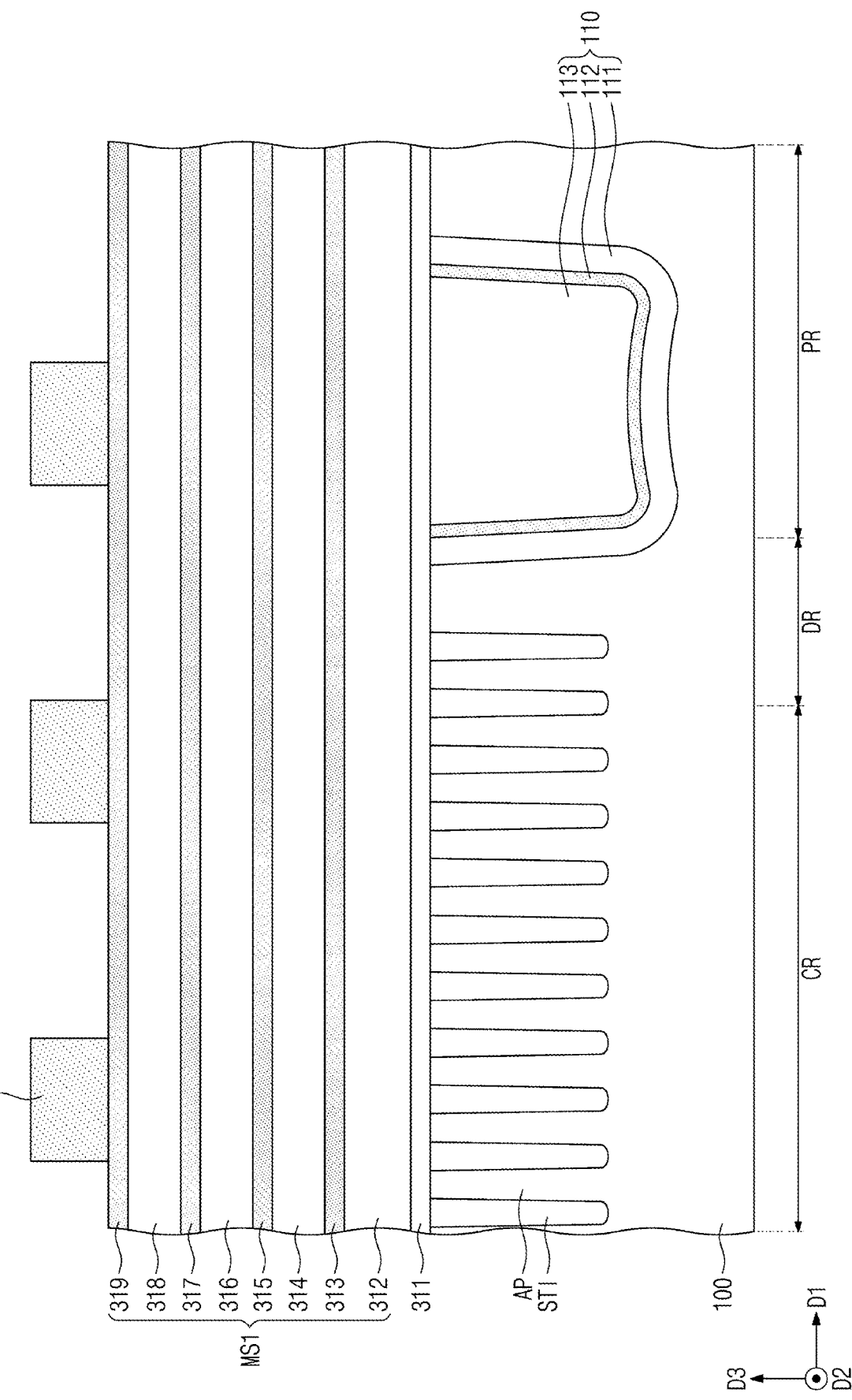

Referring to FIGS. 2A and 2B, a device isolation layer STI and a dielectric structure 110 may be formed in a substrate 100. The substrate 100 may include a cell region CR, a dummy region DR, and a peripheral region PR. The dielectric structure 110 may include a first layer 111, a second layer 112, and a third layer 113. The device isolation layer STI may be formed to create active patterns AP. Gate structures (see, for example, reference character 150 of FIG. 1C) may be formed to penetrate the active patterns AP.

Preliminary lines 311 and dielectric lines (see, for example, reference character 230 of FIGS. 1D and 1E) may be formed on the active patterns AP. The preliminary lines 311 and the dielectric lines 230 may extend in a first direction D1. The preliminary lines 311 and the dielectric lines 230 may be disposed alternately with each other in a second direction D2.

The preliminary lines 311 may include a dielectric material. For example, the preliminary lines 311 may include oxide. In some embodiments, the preliminary lines 311 may include the same material as that of connection patterns XP, as will be discussed below.

Figure 3A:
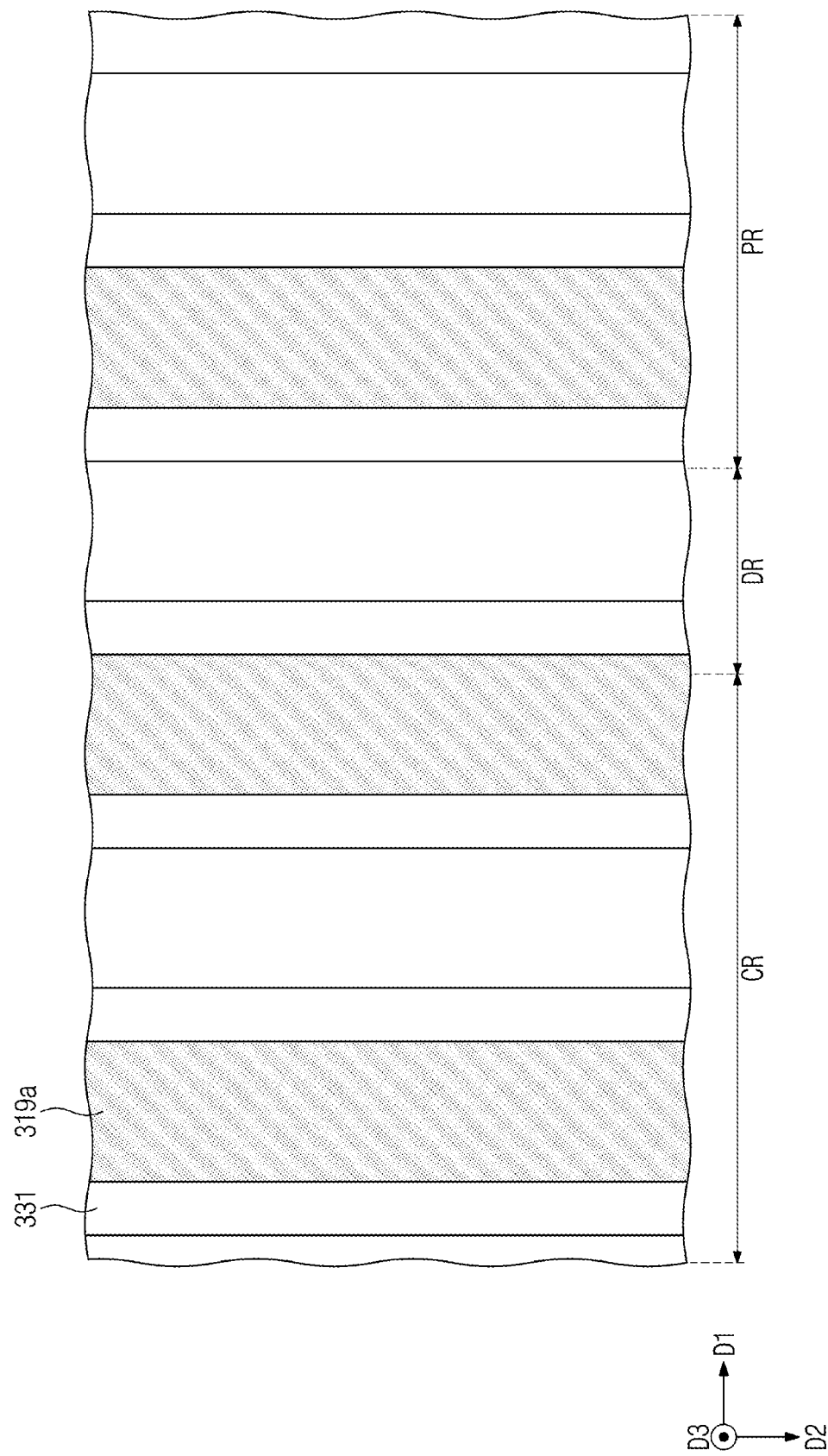
Figure 3B:
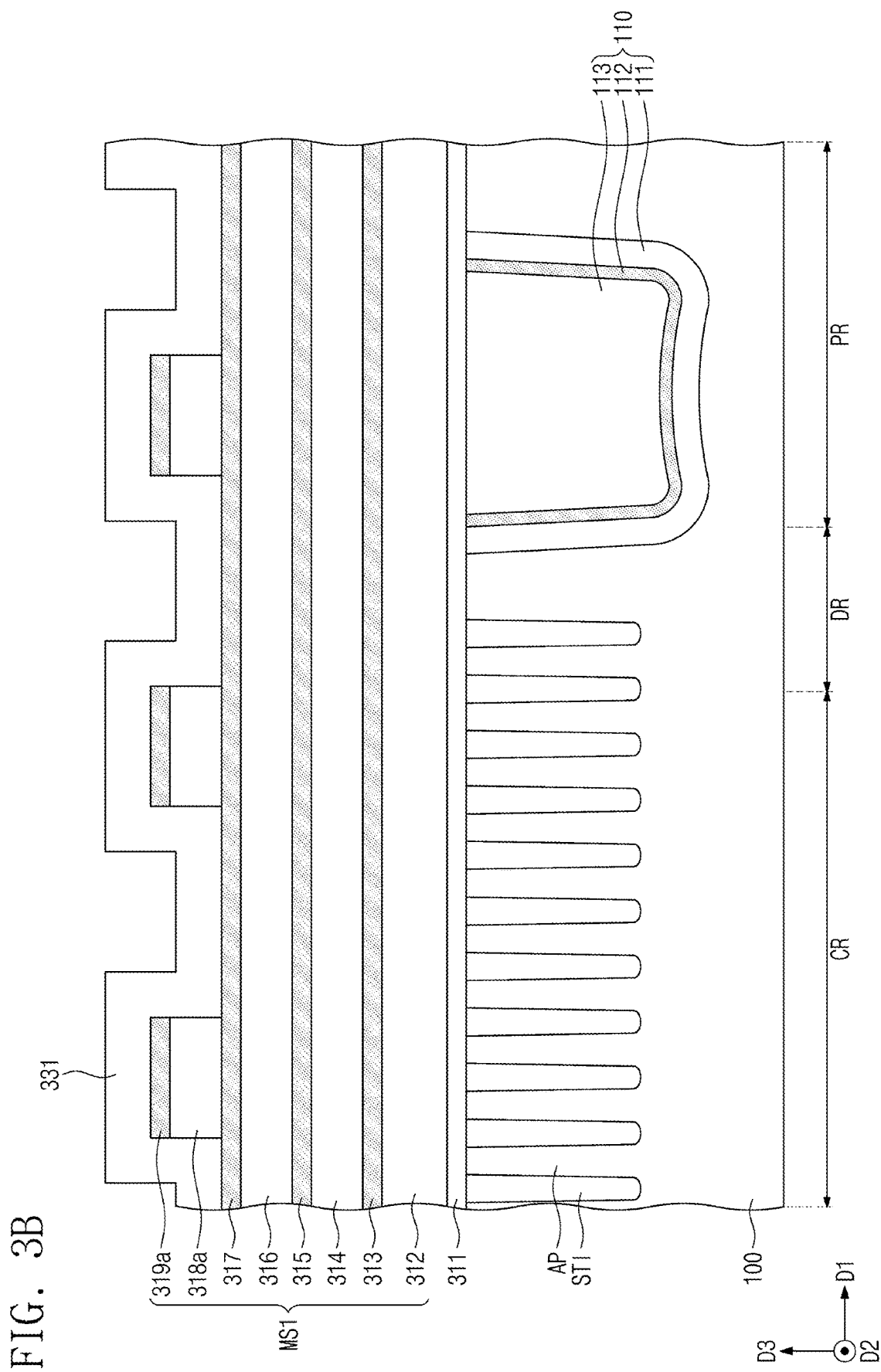

Referring to FIGS. 2B, 3B and 1H, a first mask structure MS1 may be formed on the preliminary lines 311 and the dielectric lines 230. The first mask structure MS1 may include a base mask layer 312, a first mask layer 319 a second mask layer 318, a third mask layer 317, a fourth mask layer 316, a fifth mask layer 315, a sixth mask layer 314, and a seventh mask layer 313. In some embodiments, the number of mask layers included in the first mask structure MS1 may be greater or less than that shown.

The base mask layer 312 and the first to seventh mask layers 319 to 313 may include a material that is appropriate for performing an etching process. For example, the base mask layer 312 and the first to seventh mask layers 319 to 313 may include a dielectric material.

First photoresist patterns 321 may be formed on the first mask structure MS1. The first photoresist patterns 321 may extend in the second direction D2. The first photoresist patterns 321 may be arranged in the first direction D1.

Referring to FIGS. 3A and 3B, the first photoresist patterns 321 may be used as an etching mask to perform an etching process. The etching process may etch the first mask layer 319 and the second mask layer 318. The first mask layer 319 may be etched to form first mask patterns 319a, and the second mask layer 318 may be etched to form second mask patterns 318a.

The first and second mask patterns 319a and 318a may extend in the second direction D2. The first and second mask patterns 319a and 318a may be arranged in the first direction D1.

A first spacer layer 331 may be formed to cover sidewalls of the first and second mask patterns 319a and 318a. The first spacer layer 331 may include a dielectric material.

Figure 4A:
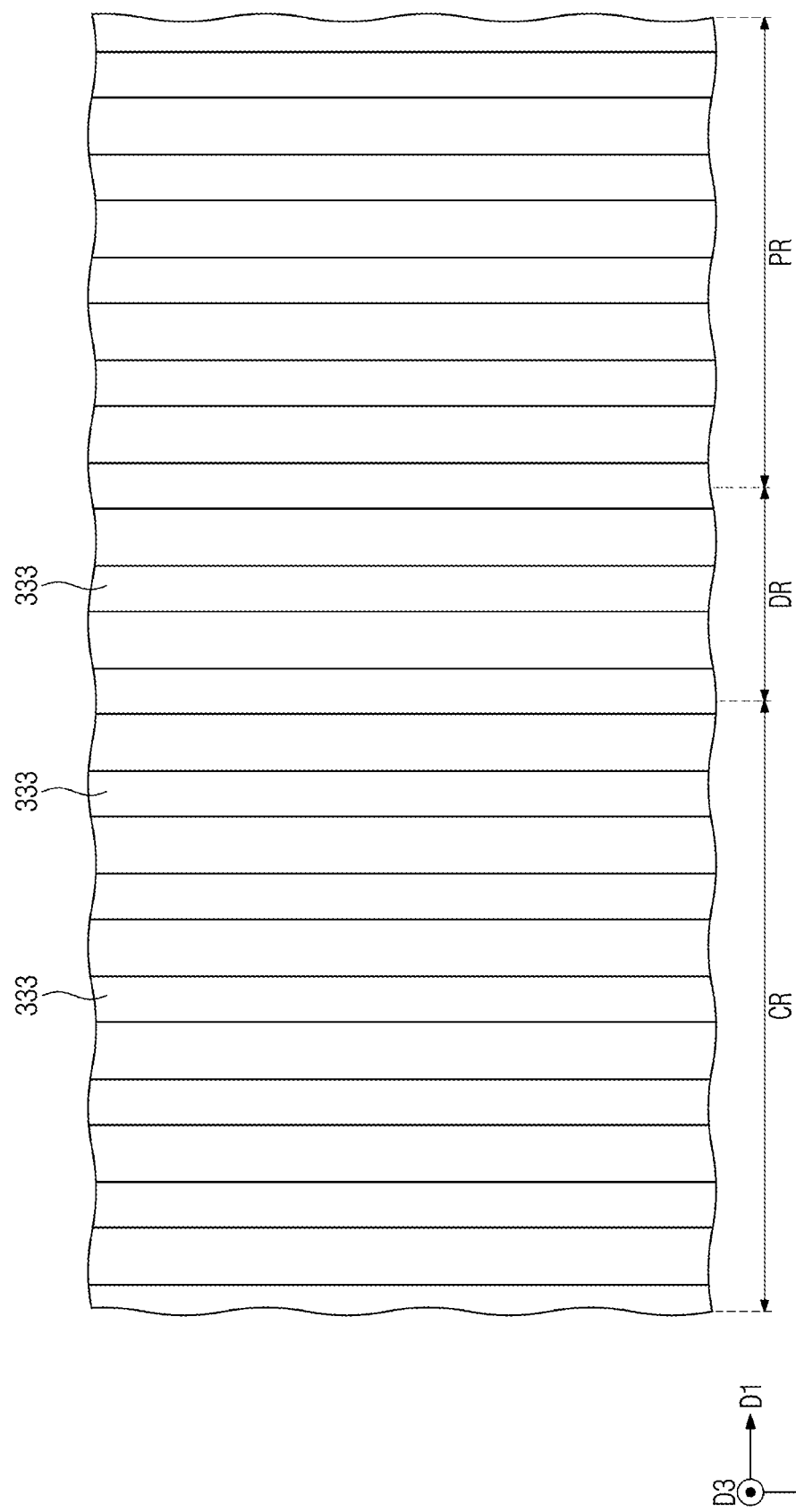
Figure 4B:
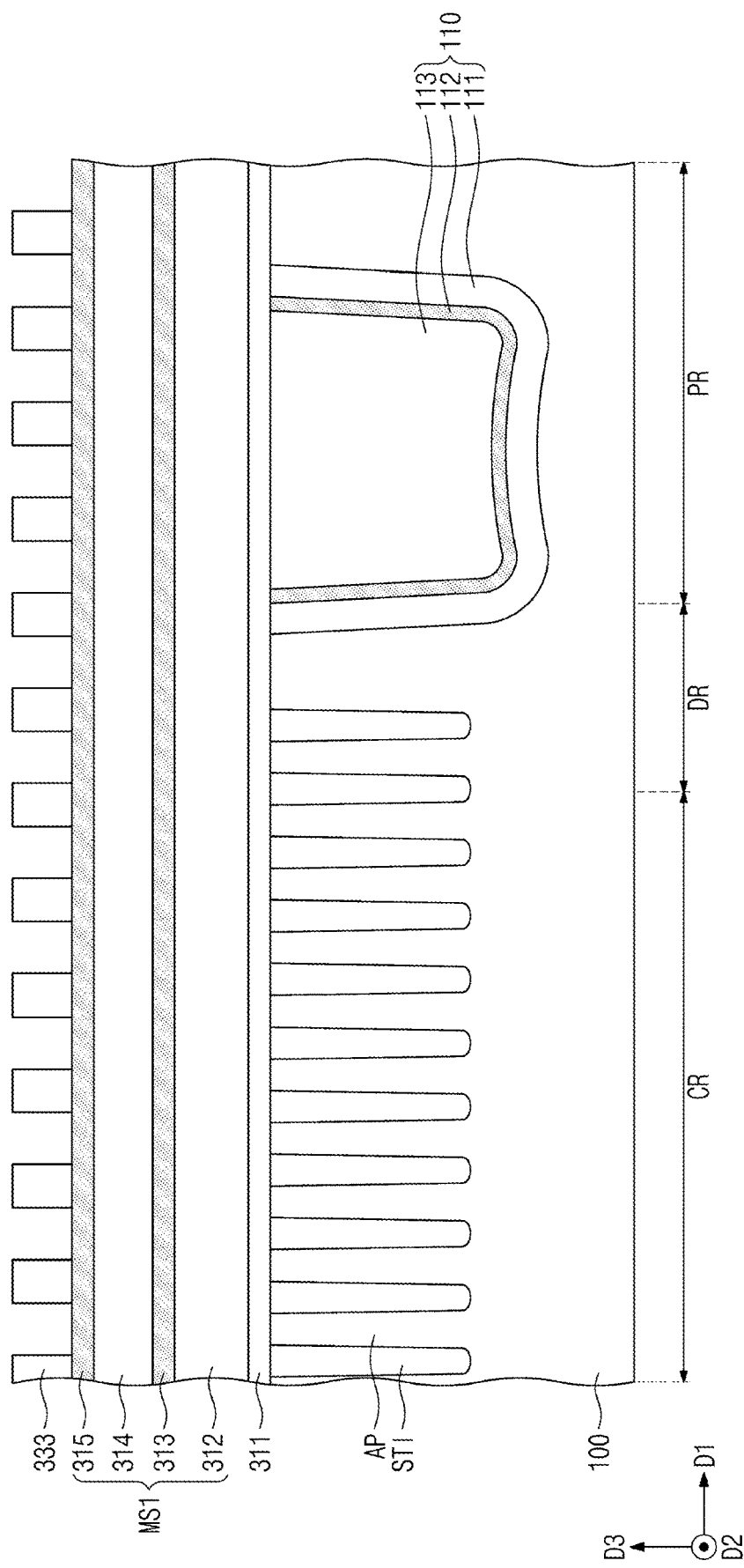

Referring to FIGS. 4A and 4B, the first spacer layer 331 may be etched to form first spacers disposed on the sidewalls of the first and second mask patterns 319a and 318a. The first spacer layers may be used as an etching mask to perform an etching process. The etching process may etch the third mask layer 317 and the fourth mask layer 316. The third mask layer 317 may be etched to form third mask patterns, and the fourth mask layer 316 may be etched to form fourth mask patterns.

A second spacer layer may be formed to cover sidewalls of the third and fourth mask patterns. The second spacer layer may include a dielectric material. The second spacer layer may be etched to form second spacers 333.

Figure 5B:
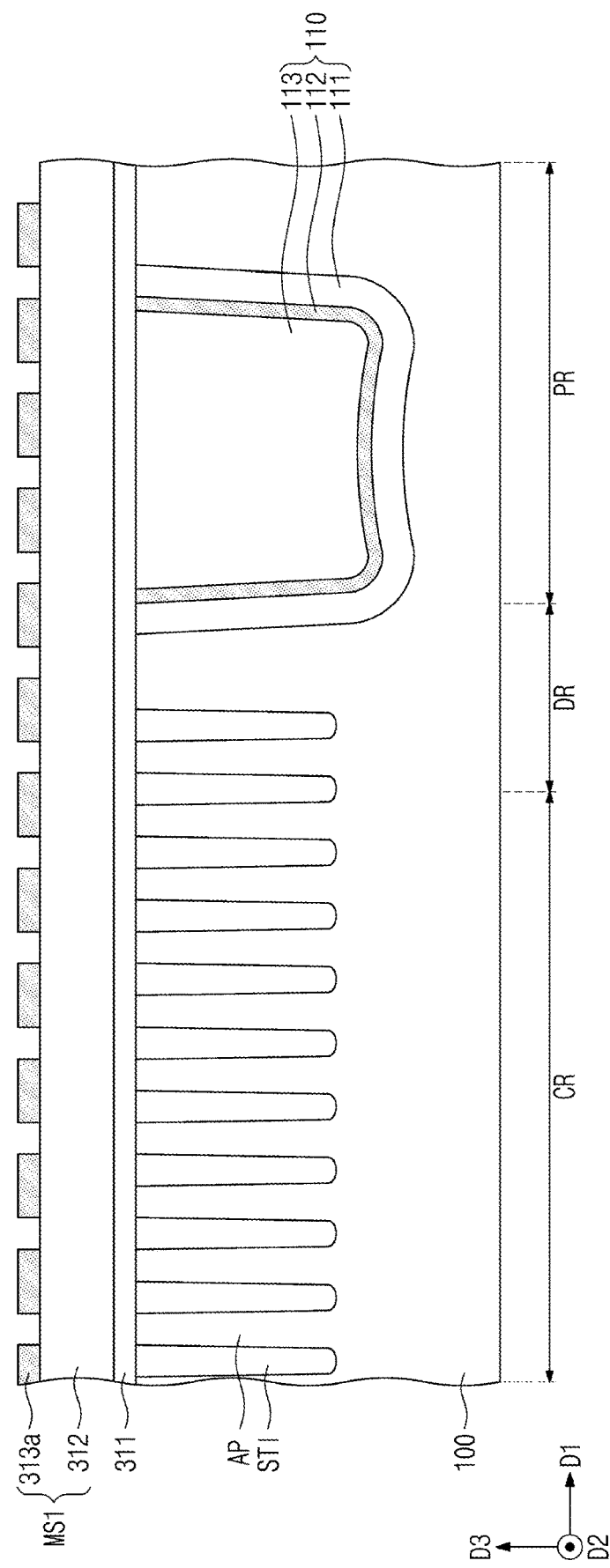

Referring to FIGS. 5A and 5B, the second spacers 333 may be used as an etching mask to perform an etching process. The etching process may etch the fifth mask layer 315, the sixth mask layer 314, and the seventh mask layer 313. The fifth mask layer 315 may be etched to form fifth mask patterns, the sixth mask layer 314 may be etched to form sixth mask patterns, and the seventh mask layer 313 may be etched to form seventh mask patterns 313a.

The seventh mask patterns 313a may extend in the second direction D2. The seventh mask patterns 313a may be arranged in the first direction D1.

Figure 6A:
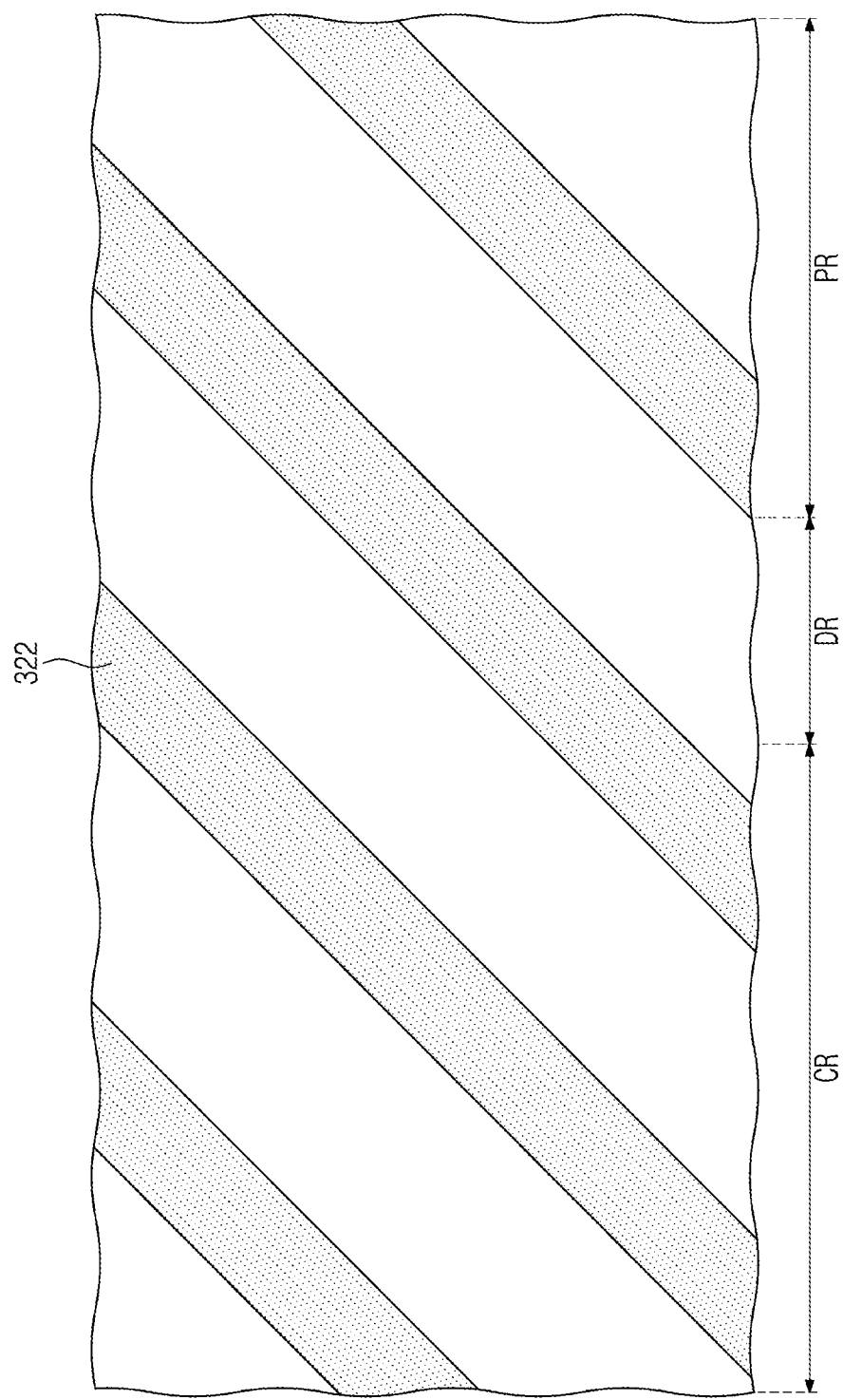

Referring to FIGS. 6A and 6B, a second mask structure MS2 may be formed on the first mask structure MS1. The second mask structure MS2 may include an eighth mask layer 344, a ninth mask layer 343, a tenth mask layer 342, and an eleventh mask layer 341. In some embodiments, the number of mask layers included in the second mask structure MS2 may be greater or less than that shown.

The eighth, ninth, tenth, and eleventh mask layers 344, 343, 342, and 341 may include a material that is suitable for performing an etching process. For example, the eighth, ninth, tenth, and eleventh mask layers 344, 343, 342, and 341 may include a dielectric material.

Second photoresist patterns 322 may be formed on the second mask structure MS2. The second photoresist patterns 322 may extend in the fourth direction D4. The second photoresist patterns 322 may intersect the first photoresist patterns 321, the seventh mask patterns 313a, the preliminary lines 311, and the dielectric lines 230. The second photoresist patterns 322 may extend obliquely to the first photoresist patterns 321, the seventh mask patterns 313a, the preliminary lines 311, and the dielectric lines 230.

Figure 7A:
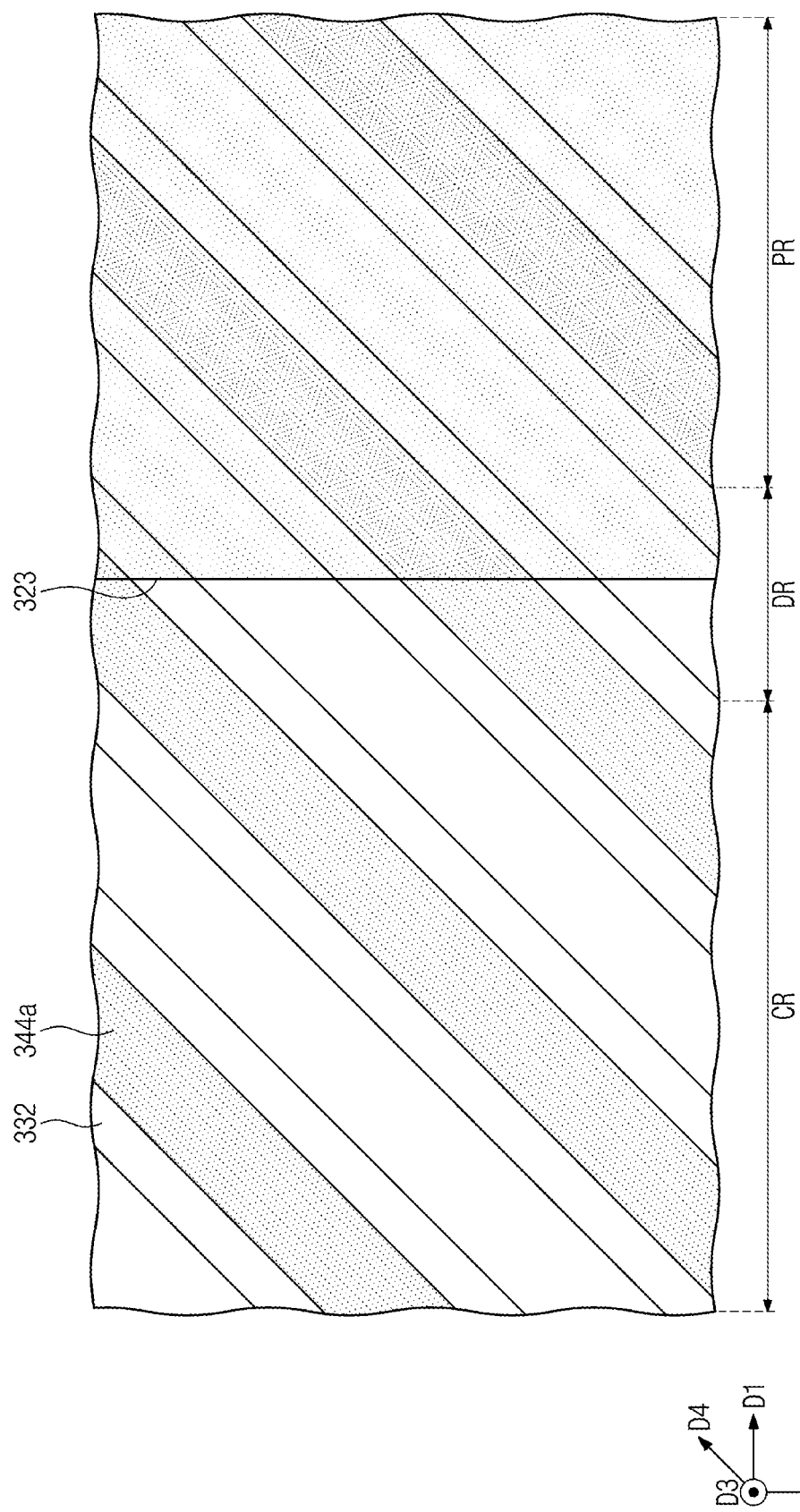
Figure 7B:
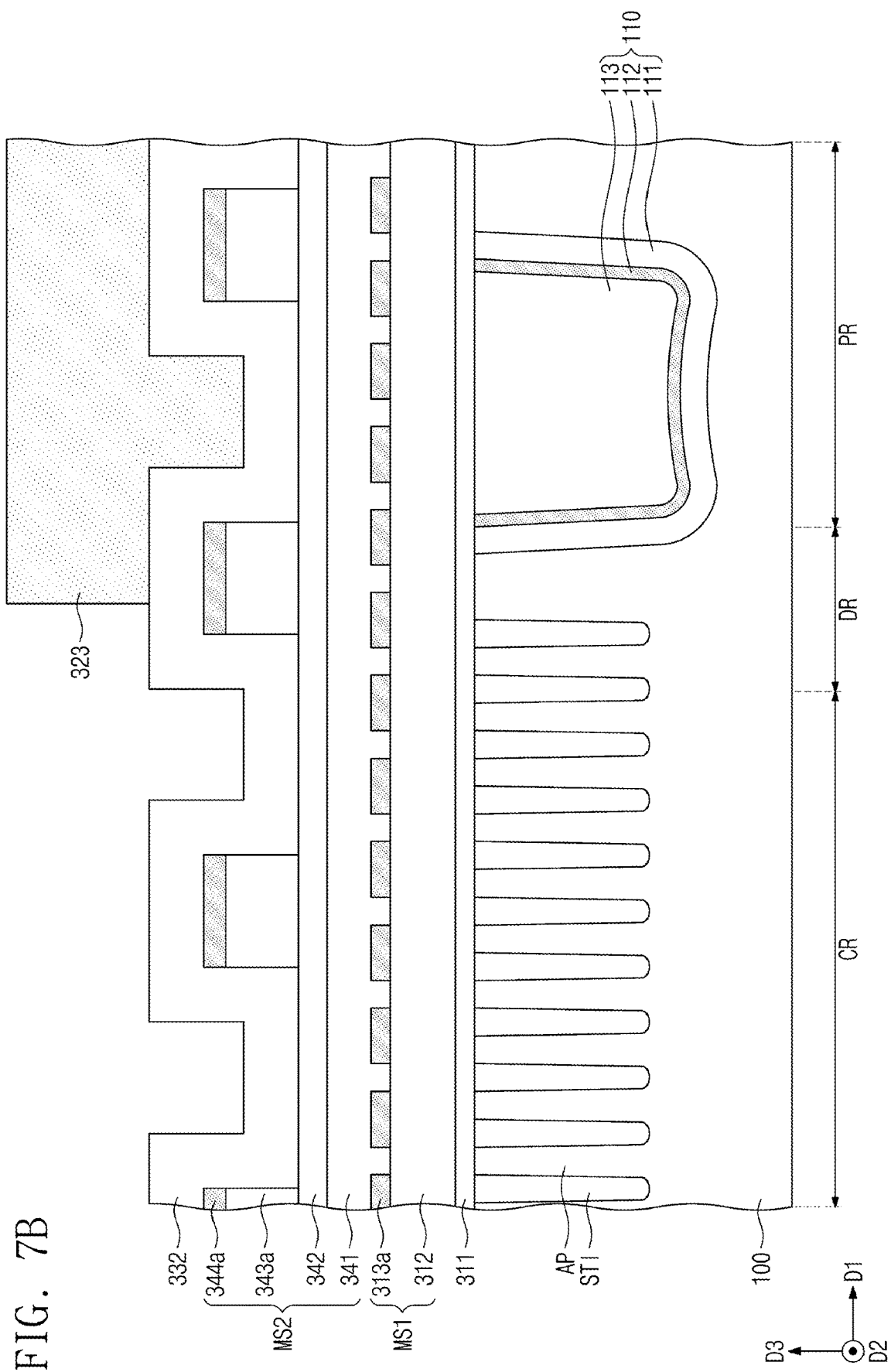

Referring to FIGS. 7A and 7B, the second photoresist patterns 322 may be used as an etching mask to perform an etching process. The etching process may etch the eighth mask layer 344 and the ninth mask layer 343. The eighth mask layer 344 may be etched to form eighth mask patterns 344a, and the ninth mask layer 343 may be etched to form ninth mask patterns 343a. The eighth and ninth mask patterns 344a and 343a may extend in the fourth direction D4.

A third spacer layer 332 may be formed. The third spacer layer 332 may cover sidewalls of the eighth and ninth mask patterns 344a and 343a. The third spacer layer 332 may include a dielectric material.

A third photoresist pattern 323 may be formed on the third spacer layer 332. The third photoresist pattern 323 may be formed over the dummy region DR and the peripheral region PR. The third spacer layer 332 may have a portion disposed over the cell region CR, and the third photoresist pattern 323 may expose the portion of the third spacer layer 332.

Figure 8:
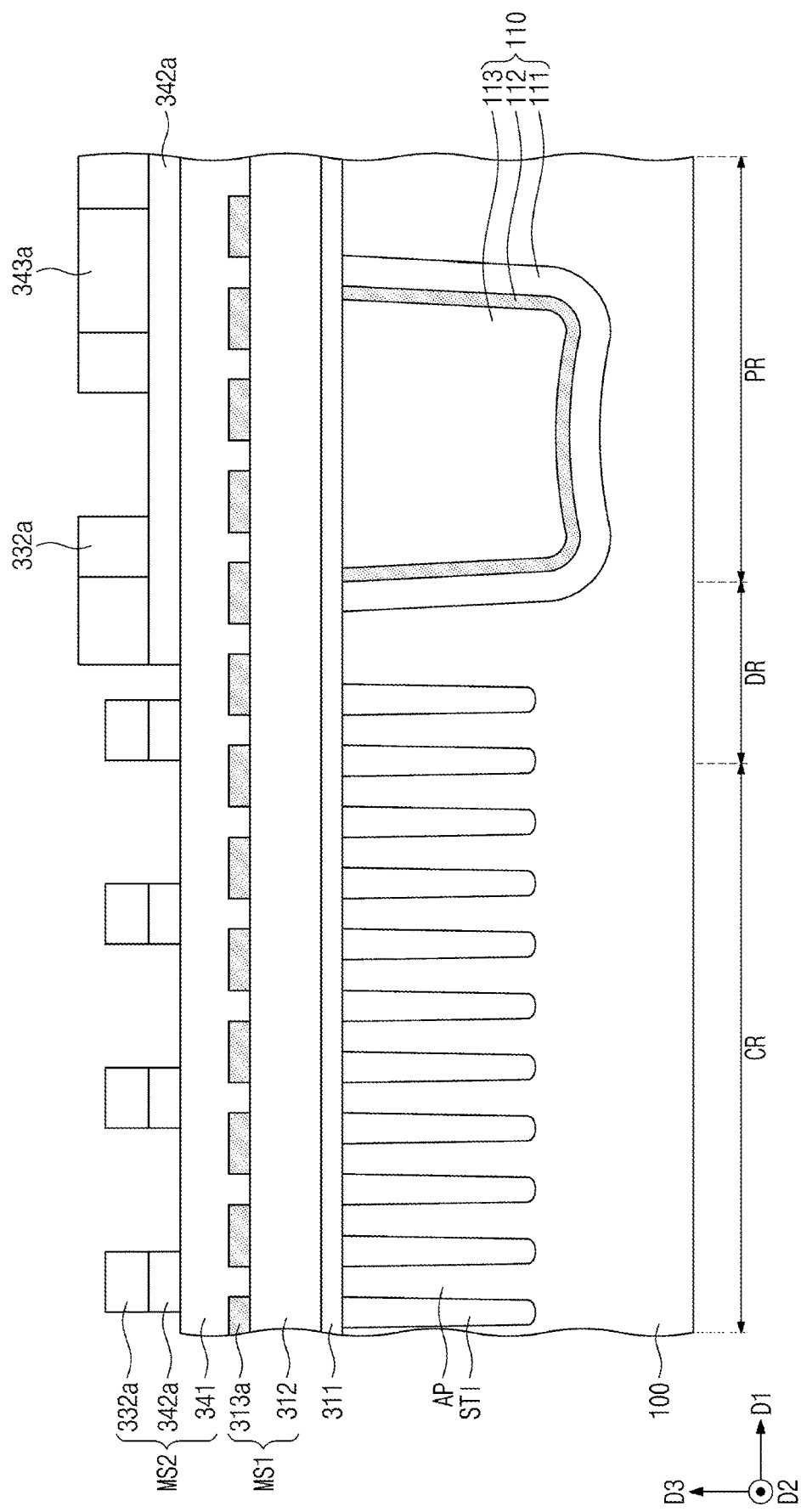

Referring to FIG. 8, the third photoresist pattern 323 may be used as an etching mask to perform an etching process. The etching process may etch the third spacer layer 332, the eighth mask patterns 344a, the ninth mask patterns 343a, and the tenth mask layer 342. The third spacer layer 332 may be etched to form third spacers 332a. The tenth mask layer 342 may be etched to form tenth mask patterns 342a. The third spacers 332a and the tenth mask patterns 342a may extend in the fourth direction D4. The third spacers 332a and the tenth mask patterns 342a may extend obliquely to the first photoresist patterns 321, the seventh mask patterns 313a, the preliminary lines 311, and the dielectric lines 230.

The ninth mask patterns 343a may remain over the dummy region DR and the peripheral region PR. The tenth mask pattern 342a disposed over the peripheral region PR may cover the eleventh mask layer 341 disposed over the peripheral region PR.

Figure 9A:
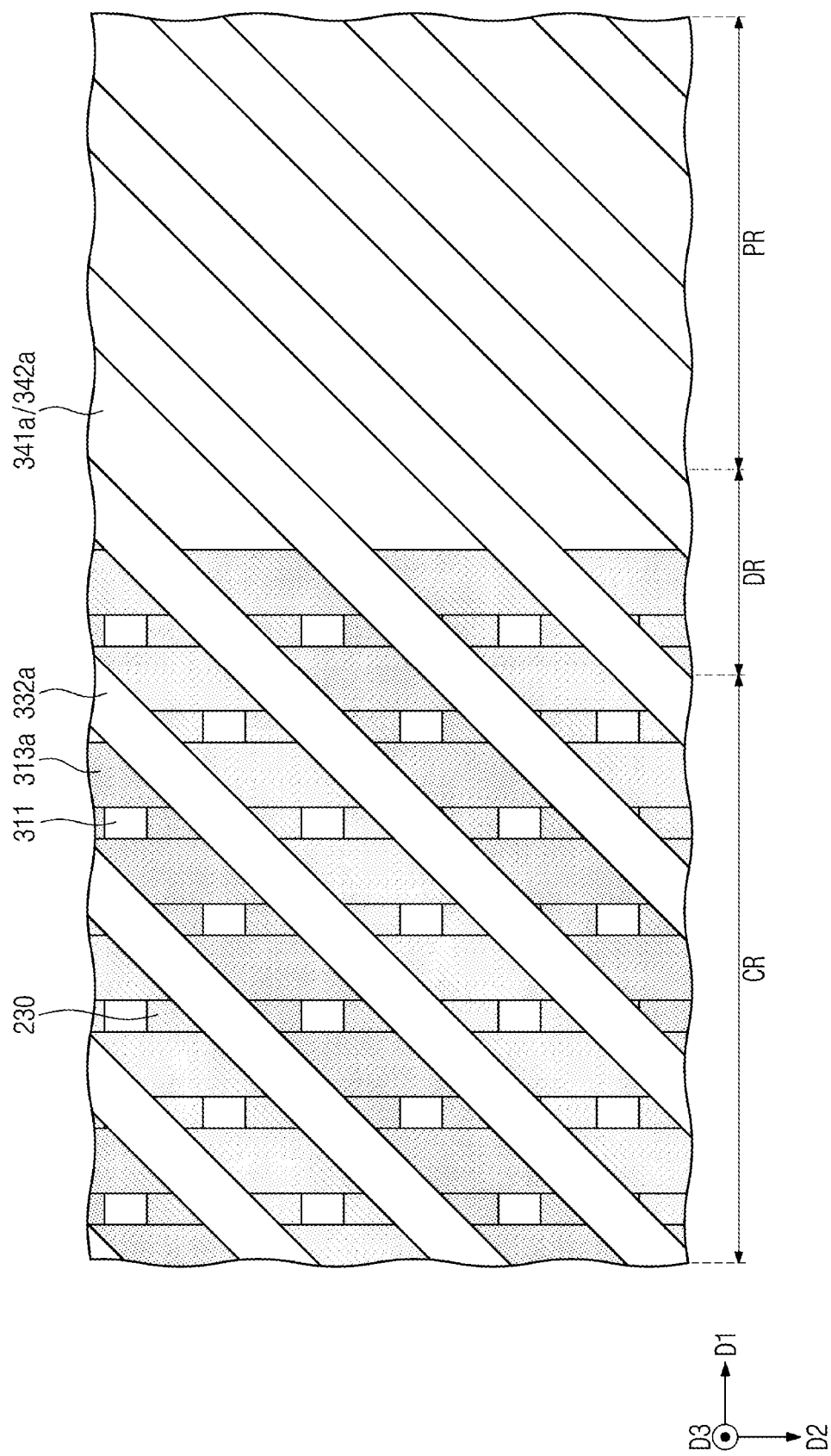
Figure 9B:
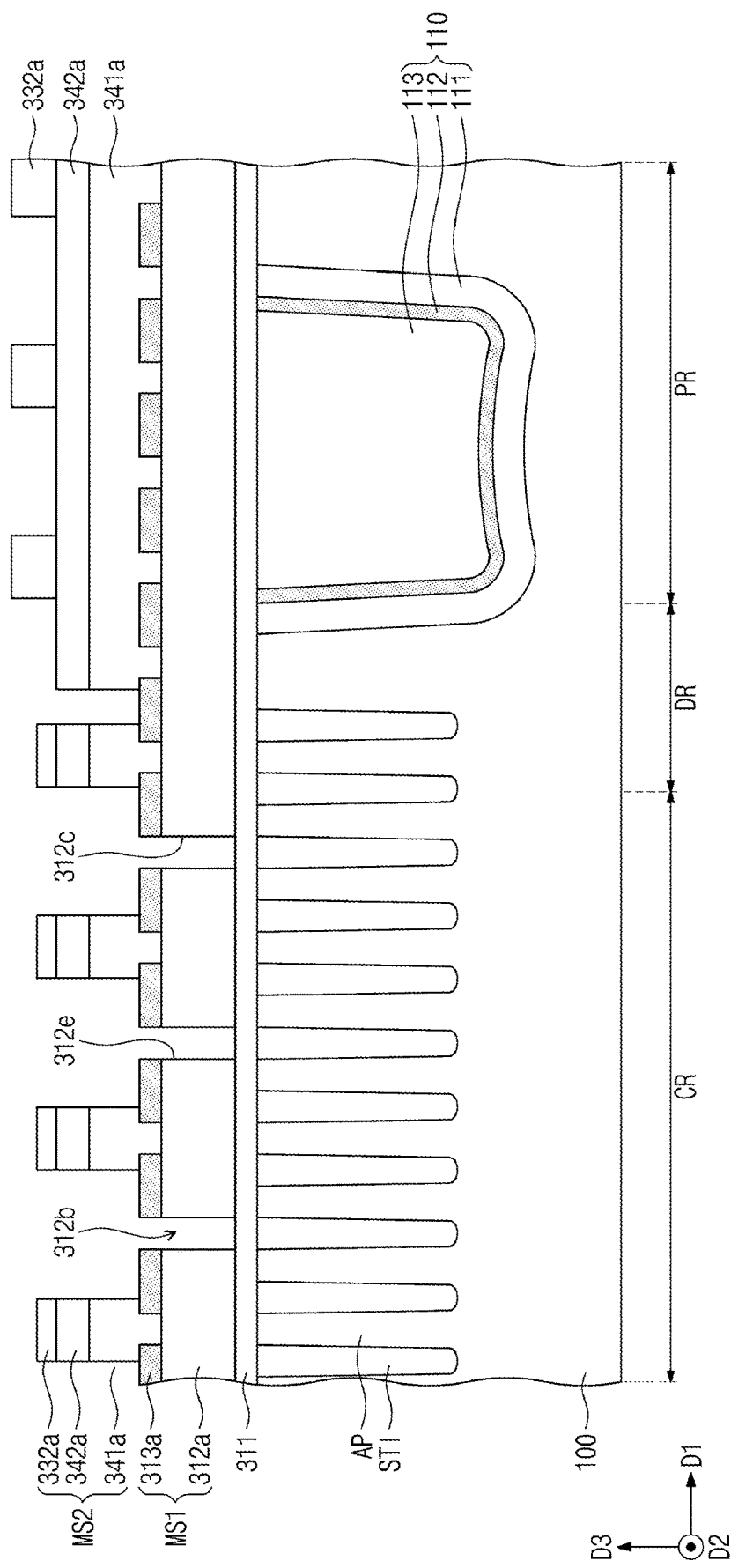

Referring to FIGS. 9A and 9B, the eleventh mask layer 341 and the base mask layer 312 may be etched. The eleventh mask layer 341 may be etched to form eleventh mask patterns 341a. The eleventh mask patterns 341a may extend in the fourth direction D4. The eleventh mask patterns 341a may extend obliquely to the first photoresist patterns 321, the seventh mask patterns 313a, the preliminary lines 311, and the dielectric lines 230.

The base mask layer 312 may be etched to form base mask patterns 312a. The base mask layer 312 of the first mask structure MS1 may be etched to form exposed openings 312b. The exposed openings 312b may be formed over the cell region CR and the dummy region DR. The base mask pattern 312a of the first mask structure MS1 may include the exposed openings 312b. The exposed openings 312b may expose the preliminary line 311 and the dielectric line 230. In some embodiments, one exposed opening 312b may expose one preliminary line 311 and two dielectric lines 230.

As the seventh mask patterns 313a extending in the second direction D2 and the third spacers 332a extending in the fourth direction D4 are used as an etching mask to form the exposed openings 312b, each of the exposed openings 312b may have a parallelogram shape.

Figure 10B:
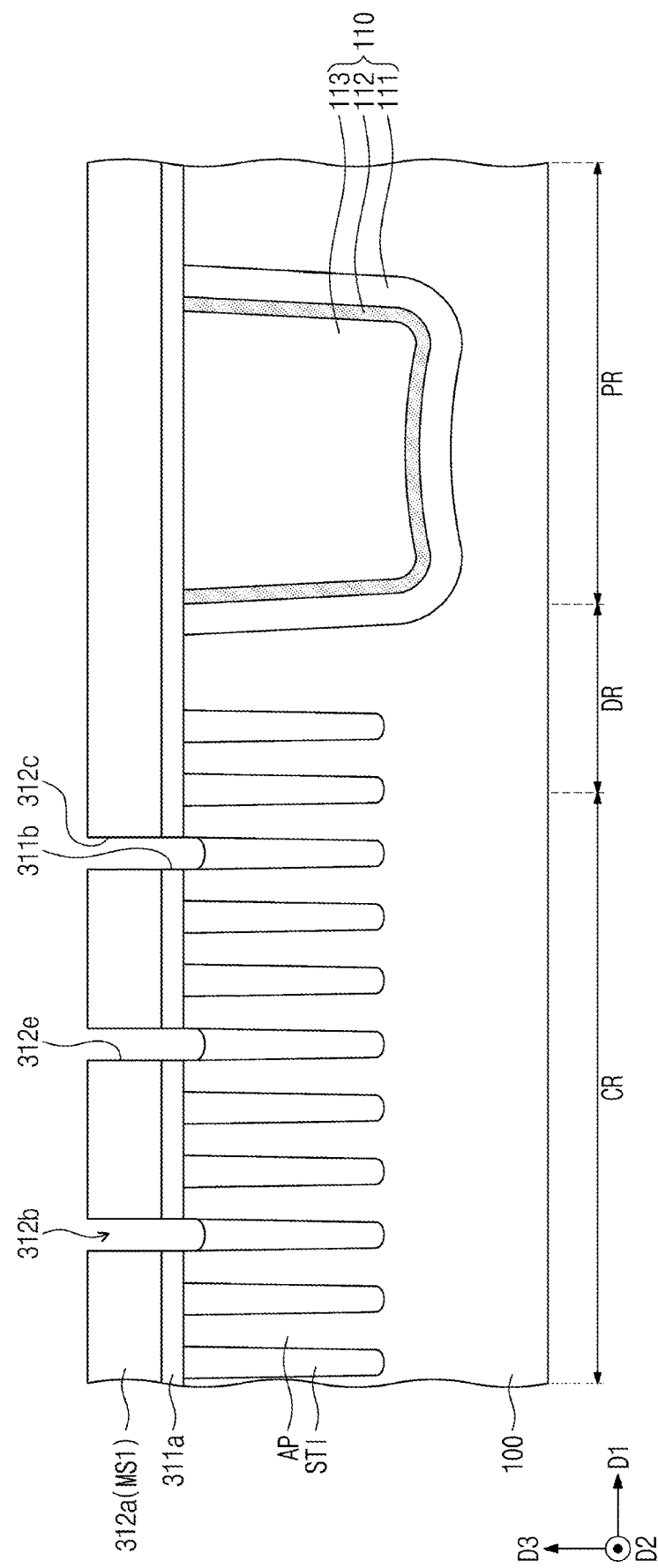

Referring to FIGS. 10A and 10B, the exposed opening 312b of the base mask pattern 312a may include a first sidewall 312c, a second sidewall 312d, a third sidewall 312e, and a fourth sidewall 312f. The first and third sidewalls 312c and 312e of the exposed opening 312b may be parallel to the second direction D2. The first and third sidewall 312c and 312e of the exposed opening 312b may stand opposite to each other. The second and fourth sidewalls 312d and 312f of the exposed opening 312b may be parallel to the fourth direction D4. The second and fourth sidewalls 312d and 312f of the exposed opening 312b may stand opposite to each other. The exposed opening 312b may be configured such that each of the second and fourth sidewalls 312d and 312f connects the first and third sidewalls 312c and 312e to each other.

An angle between the first and second sidewalls 312c and 312d of the exposed opening 312b may be less than an angle between the second and third sidewalls 312d and 312e of the exposed opening 312b. An angle between the first and fourth sidewalls 312c and 312f of the exposed opening 312b may be greater than an angle between the third and fourth sidewalls 312e and 312f of the exposed opening 312b. The angle between the first and second sidewalls 312c and 312d of the exposed opening 312b may be the same as the angle between the third and fourth sidewalls 312e and 312f of the exposed opening 312b. The angle between the second and third sidewalls 312d and 312e of the exposed opening 312b may be the same as the angle between the first and fourth sidewalls 312c and 312f of the exposed opening 312b.

The base mask pattern 312a may be used as an etching mask to etch the preliminary lines 311 and the dielectric lines 230. Therefore, separation openings 311b may be formed in the preliminary lines 311 and the dielectric lines 230. The separation openings 311b may be defined by the preliminary lines 311 and the dielectric lines 230. The separation opening 311b may have a parallelogram shape when viewed in plan. In some embodiments, one preliminary line 311 and two dielectric lines 230 may be etched through one exposed opening 312b. The preliminary line 311 may be etched into a plurality of preliminary patterns 311a that are spaced apart from each other.

In some implementations, when the preliminary line 311 includes the same material as that of the connection pattern XP, the preliminary pattern 311a formed by etching the preliminary line 311 may be the same as the connection pattern XP.

Figure 11B:
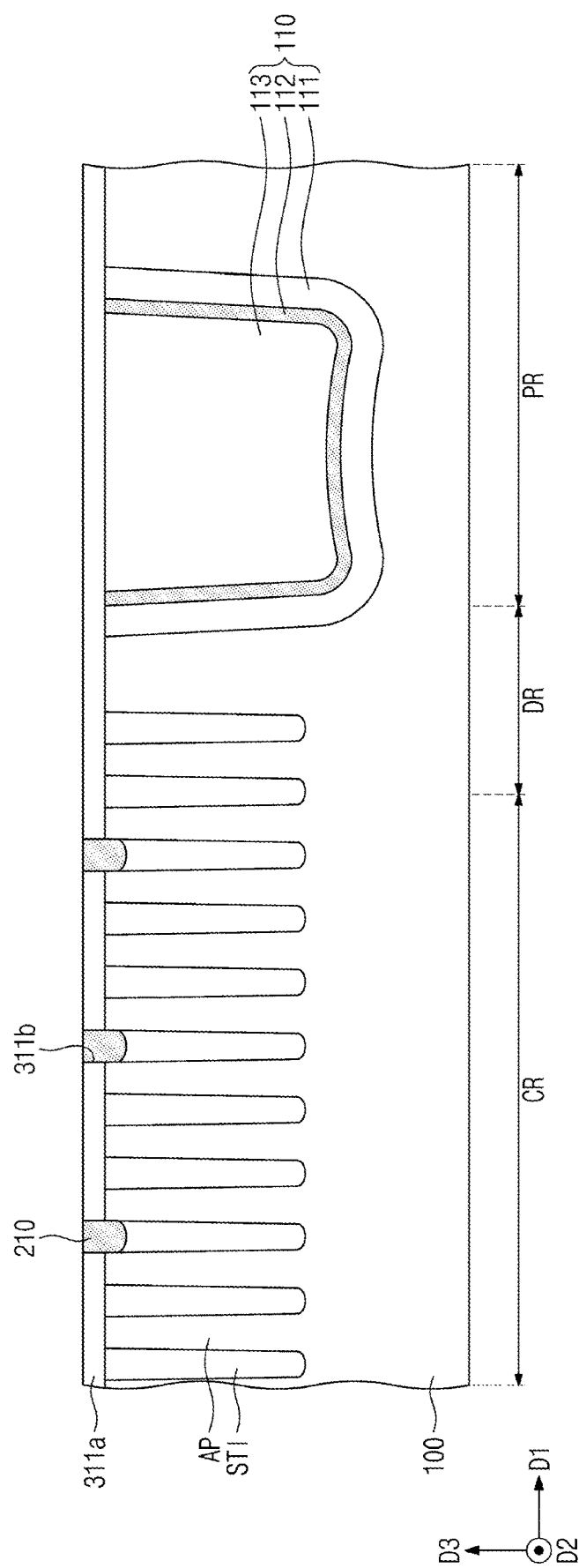

Referring to FIGS. 11A and 11B, separation patterns may be formed which include cell separation patterns 210 and dummy separation patterns 220 in the separation openings 311b. The cell separation pattern 210 may have first sidewalls 210e that correspond to the first and third sidewalls 312c and 312e of the exposed opening 312b of the base mask pattern 312a. The cell separation pattern 210 may have flat second sidewalls 210c. The second sidewalls 210c of the cell separation pattern 210 may correspond to the second and fourth sidewalls 312d and 312f of the exposed opening 312b in the base mask pattern 312a.

Figure 12:
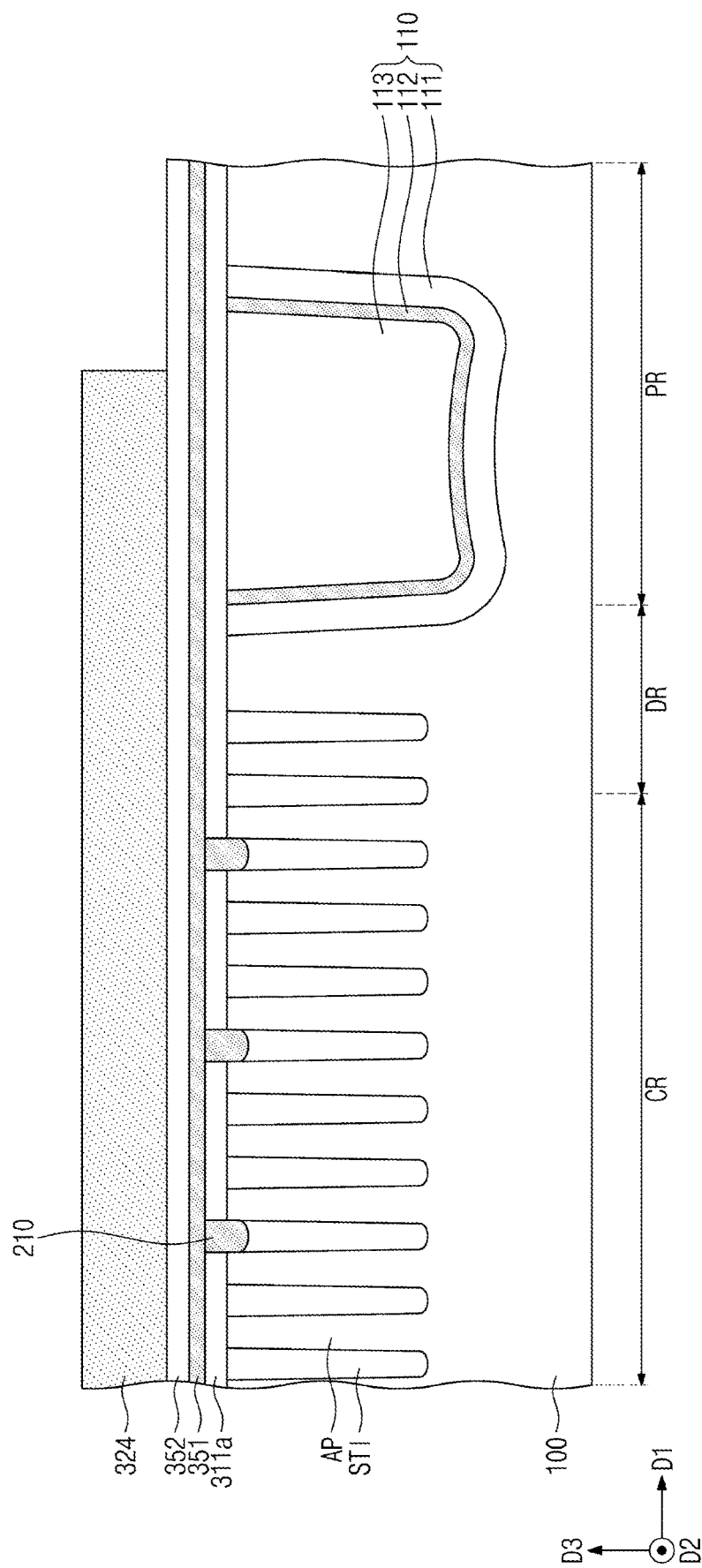

Referring to FIG. 12, a first preliminary layer 351 may be formed on the preliminary patterns 311a, the cell separation patterns 210, and the dummy separation patterns 220. A second preliminary layer 352 may be formed on the first preliminary layer 351. For example, the first preliminary layer 351 may include a nitride, and the second preliminary layer 352 may include an oxide.

Fourth photoresist patterns 324 may be formed on the second preliminary layer 352. The fourth photoresist pattern 324 may expose the second preliminary layer 352 over the peripheral region PR.

Figure 13:
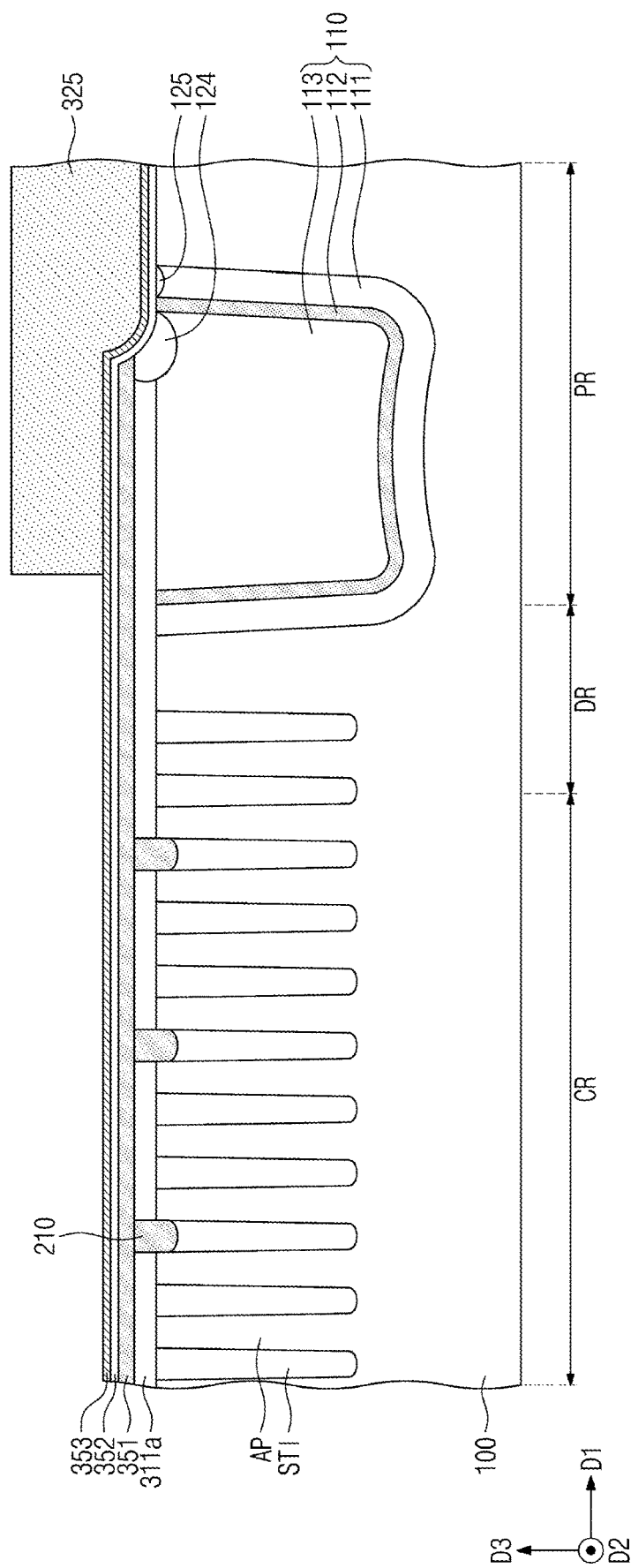

Referring to FIG. 13, the fourth photoresist pattern 324 may be used as an etching mask to perform an etching process. The etching process may etch the first preliminary layer 351, the second preliminary layer 352, the preliminary patterns 311a, and the first and third layers 111 and 113 of the dielectric structure 110. A first oxide pattern 124 may be formed on the third layer 113 of the dielectric structure 110, and a second oxide pattern 125 may be formed on the first layer 111 of the dielectric structure 110.

A metal layer 353 may be formed on the second preliminary layer 352, the first oxide pattern 124, and the second oxide pattern 125. A fifth photoresist pattern 325 may be formed on the metal layer 353. The fifth photoresist pattern 325 may expose the metal layer 353 over the cell region CR.

Figure 14:
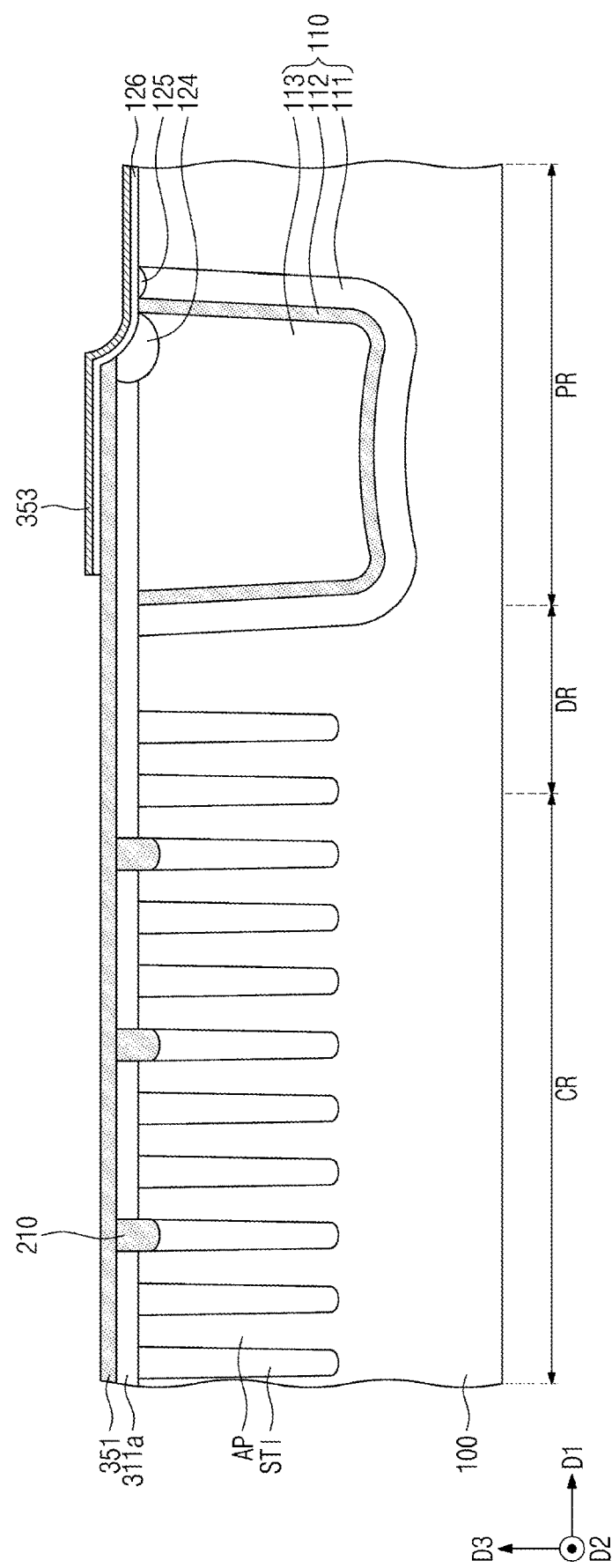

Referring to FIG. 14, the fifth photoresist pattern 325 may be used as an etching mask to perform an etching process. The etching process may etch the metal layer 353 and the second preliminary layer 352. The etched second preliminary layer 352 may be defined as a third dielectric layer 126. The metal layer 353 may be provided on the third dielectric layer 126.

Figure 15:
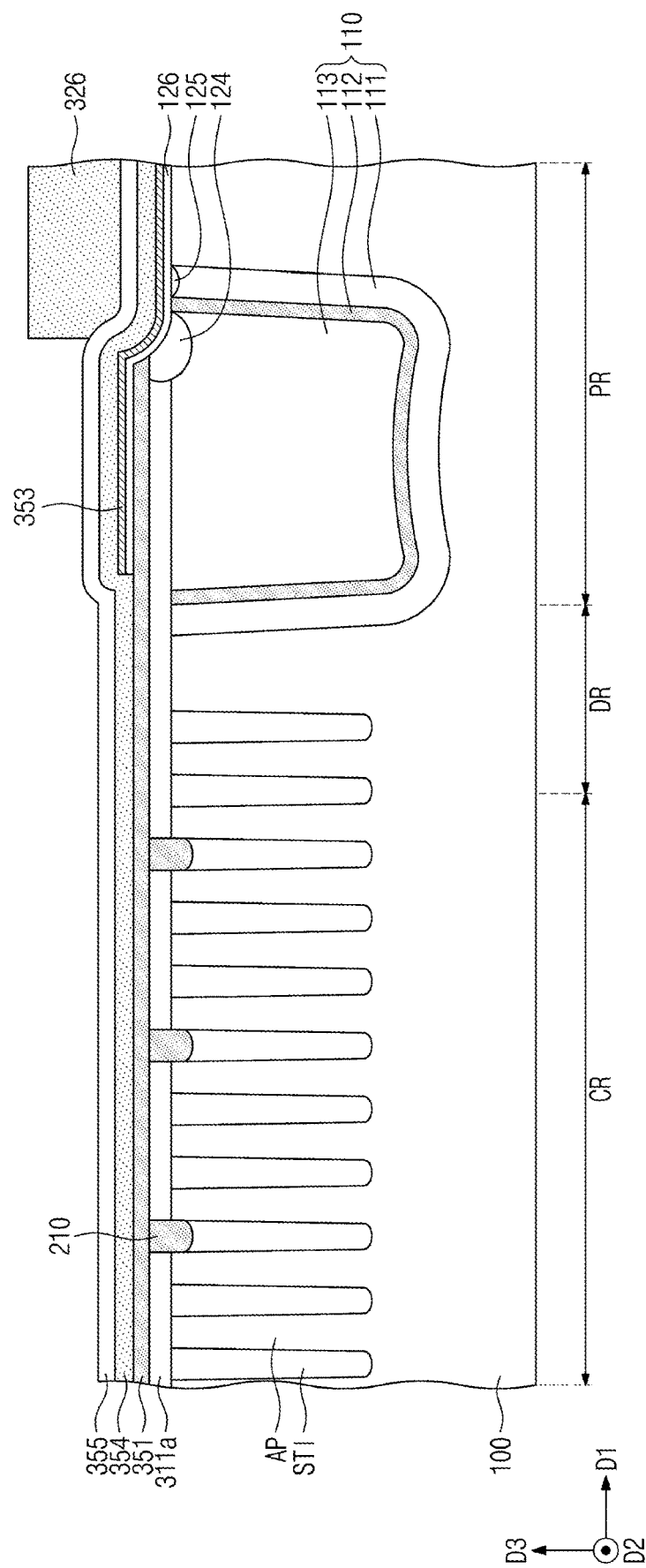

Referring to FIG. 15, a third preliminary layer 354 may be formed on the metal layer 353 and the first preliminary layer 351. A fourth preliminary layer 355 may be formed on the third preliminary layer 354. For example, the third preliminary layer 354 may include polysilicon, and the fourth preliminary layer 355 may include an oxide. A sixth photoresist pattern 326 may be formed on the fourth preliminary layer 355. The sixth photoresist pattern 326 may be formed over the peripheral region PR.

Figure 16:
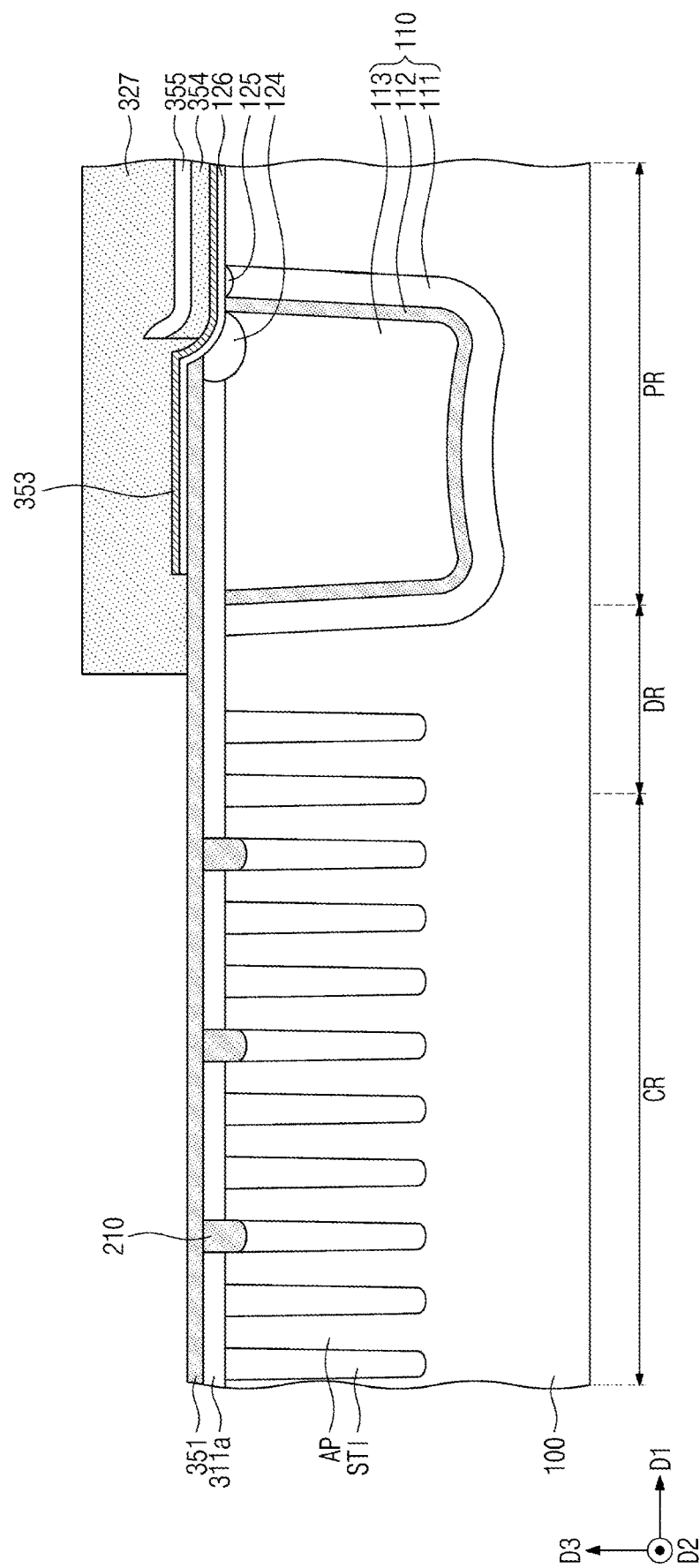

Referring to FIG. 16, the sixth photoresist pattern 326 may be used as an etching mask to perform an etching process. The etching process may etch the fourth preliminary layer 355 and the third preliminary layer 354. A seventh photoresist pattern 327 may be formed. The seventh photoresist pattern 327 may expose the first preliminary layer 351 over the cell region CR.

Figure 17:
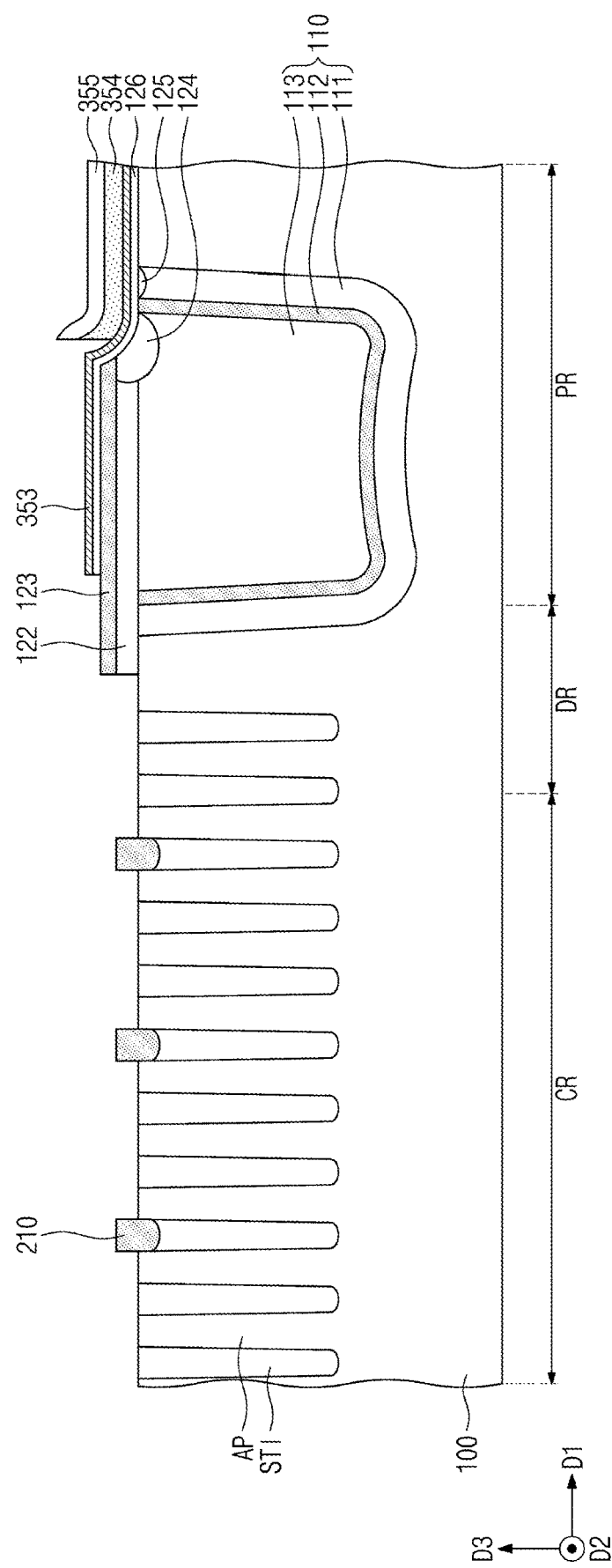

Referring to FIG. 17, the seventh photoresist pattern 327 may be used as an etching mask to perform an etching process. The etching process may etch the first preliminary layer 351 and the preliminary patterns 311a. The etched first preliminary layer 351 may be defined as a second dielectric layer 123. The preliminary patterns 311a may be etched over the cell region CR. The etched preliminary pattern 311a over the peripheral region PR may be defined as a first dielectric layer 122.

Figure 18:
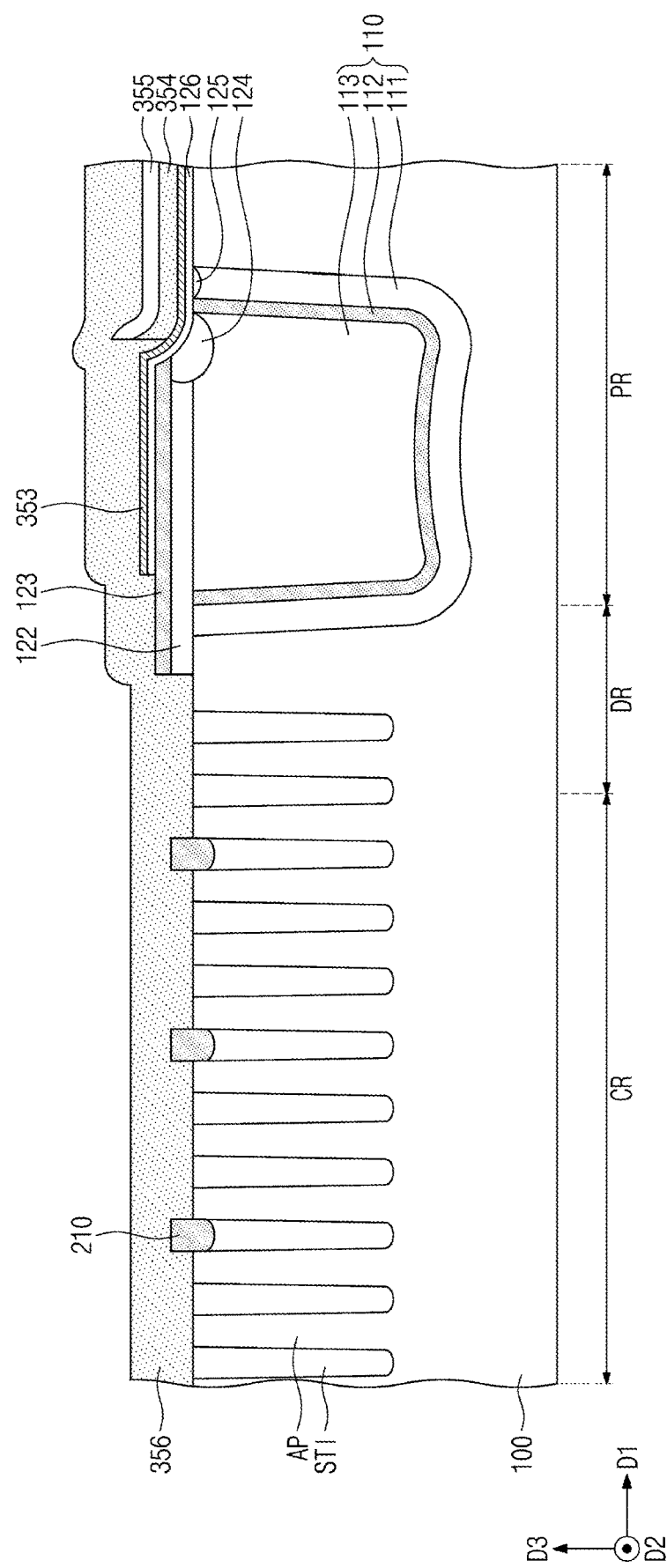

Referring to FIG. 18, a preliminary connection layer 356 may be formed. The preliminary connection layer 356 may be formed on the cell separation patterns 210, the second dielectric layer 123, the metal layer 353, and the fourth preliminary layer 355. For example, the preliminary connection layer 356 may include polysilicon.

Figure 19A:
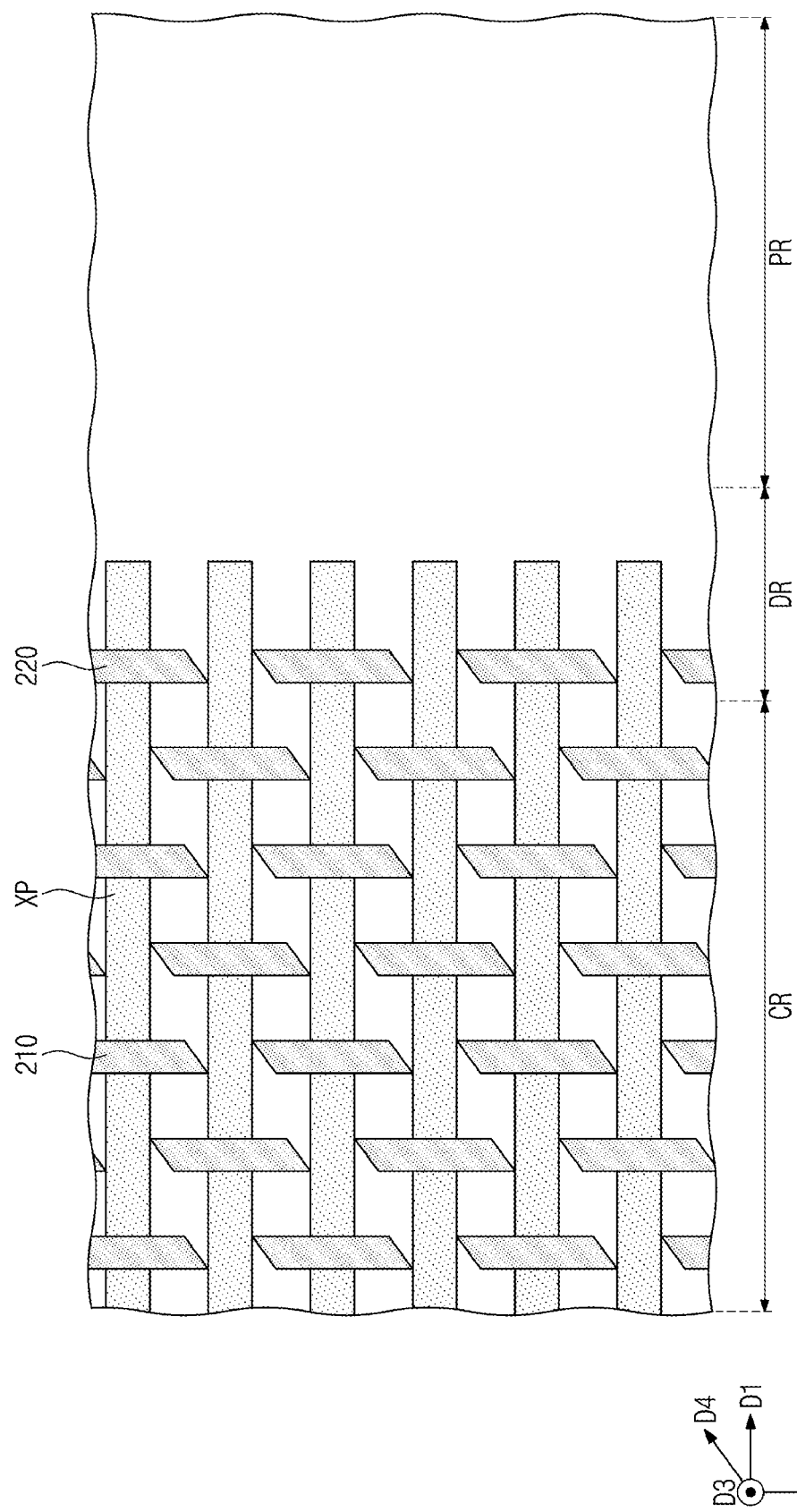
Figure 19B:
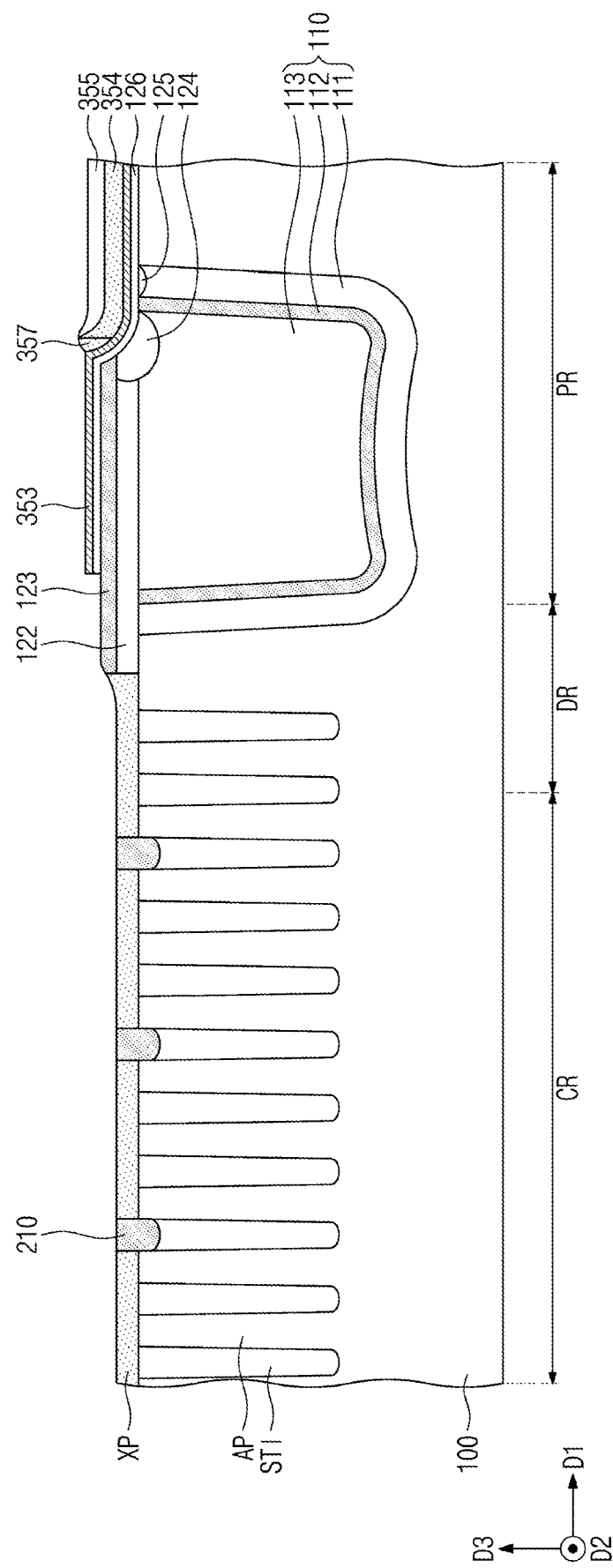

Referring to FIGS. 19A and 19B, the preliminary connection layer 356 may be etched. Connection patterns XP may be formed by etching the preliminary connection layer 356. The etching of the preliminary connection layer 356 may form a buffer pattern 357 on the metal layer 353 and the third preliminary layer 354.

Figure 20A:
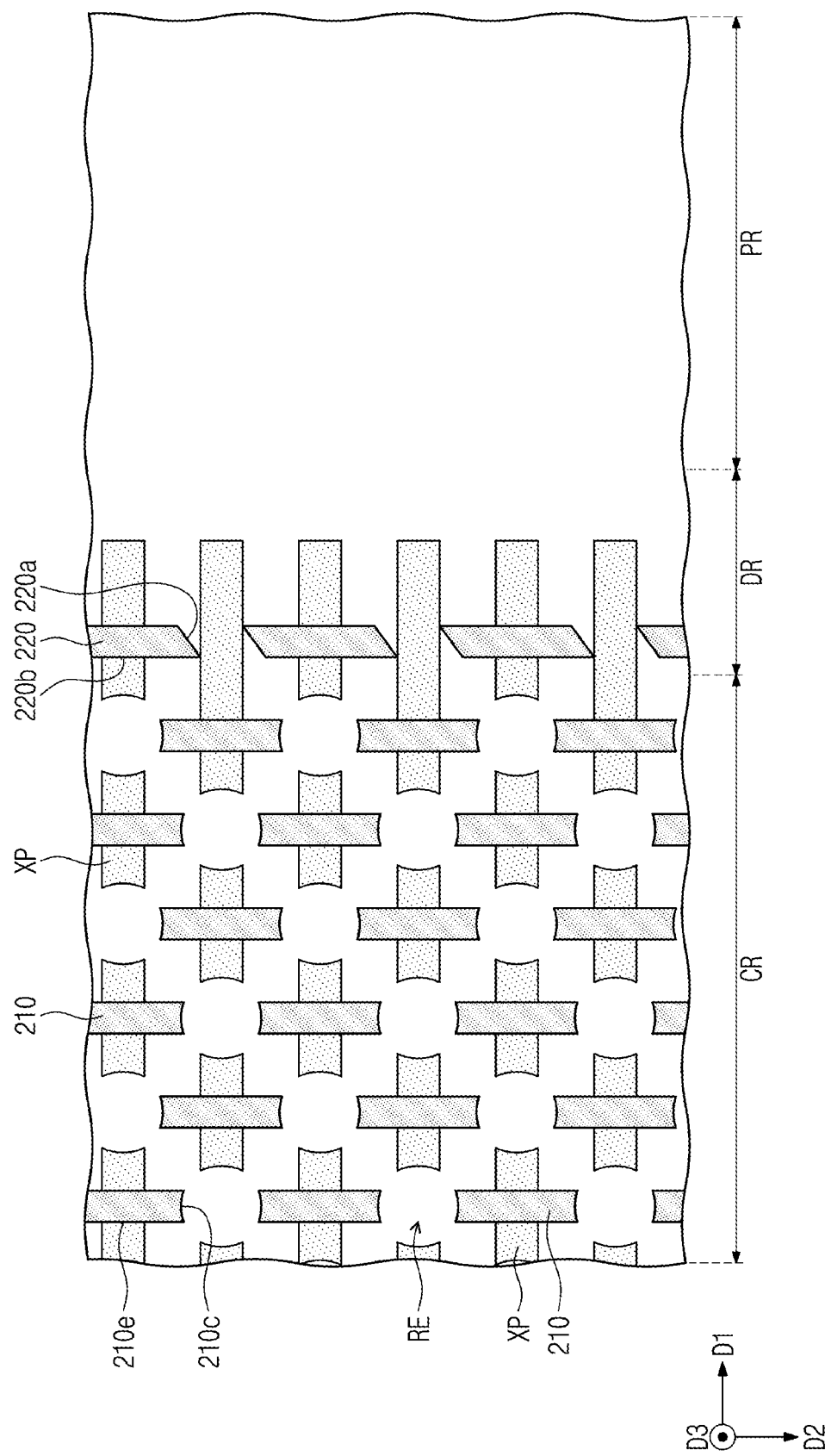
Figure 20B:
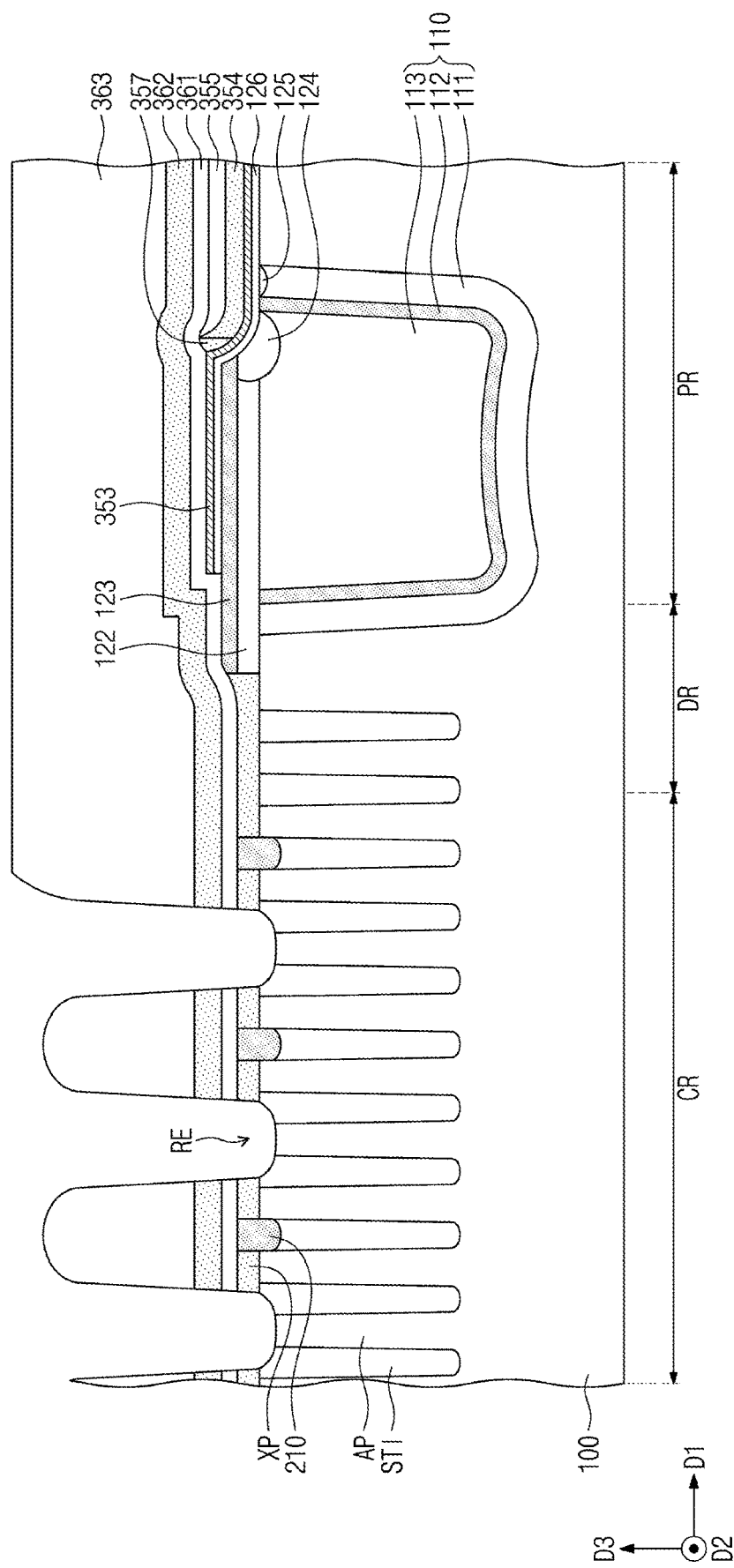
Figure 20C:
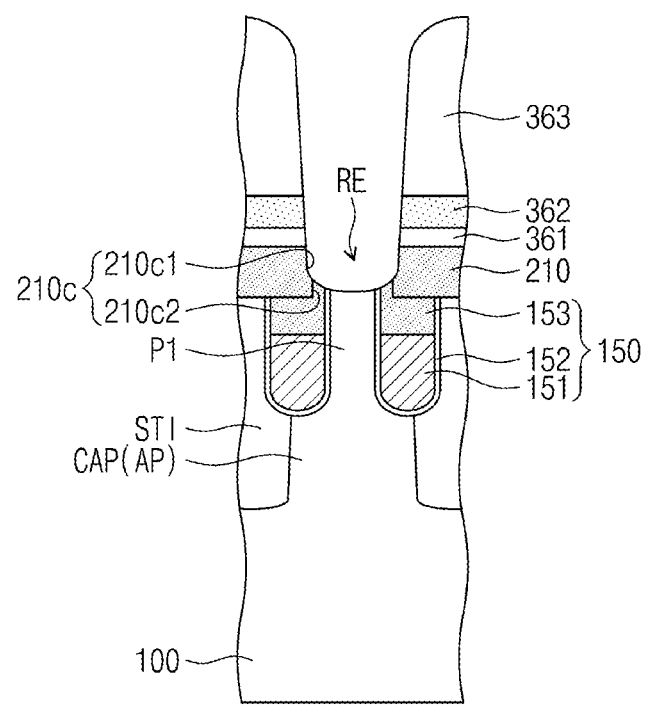

Referring to FIGS. 20A, 20B, and 20C, a preliminary dielectric layer 361 may be formed on the connection patterns XP, the second dielectric layer 123, the metal layer 353, the buffer pattern 357, and the fourth preliminary layer 355. In some embodiments, the preliminary dielectric layer 361 may include a plurality of dielectric layers. A first preliminary conductive layer 362 may be formed on the preliminary dielectric layer 361. The first preliminary conductive layer 362 may include, for example, polysilicon. A fifth dielectric layer 363 may be formed on the first preliminary conductive layer 362.

Recesses RE may be formed. The recesses RE may penetrate the fifth preliminary layer 363, the first preliminary conductive layer 362, the preliminary dielectric layer 361, and the connection pattern XP. The active pattern AP may be exposed through the recess RE.

In a process in thich the recess RE is formed, the cell separation pattern 210 may be etched. The etching of the cell separation pattern 210 may define an upper portion 210c1 and a lower portion 210c2 of the second sidewall 210c of the cell separation pattern 210. The upper portion 210c1 of the second sidewall 210c of the cell separation pattern 210 may be a part that is etched in the formation of the recess RE, and the lower portion 210c2 of the second sidewall 210c of the cell separation pattern 210 may be a part that is not etched in the formation of the recess RE. The upper portion 210c1 of the second sidewall 210c of the cell separation pattern 210 may become curved in the etching process.

Figure 21:
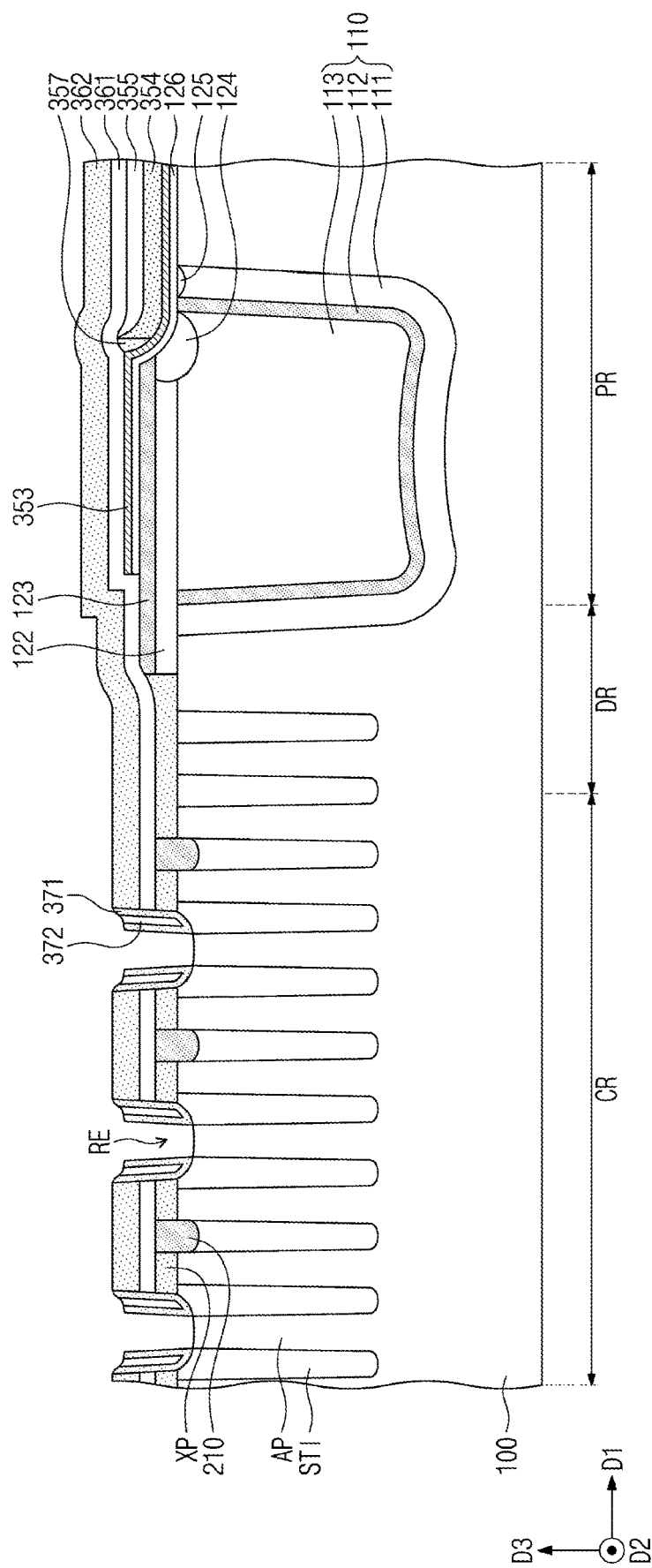

Referring to FIG. 21, a first preliminary spacer 371 and a second preliminary spacer 372 may be formed in the recess RE. The second preliminary spacer 372 may be provided in the first preliminary spacer 371. The first preliminary spacer 371 may include, for example, a nitride. The second preliminary spacer 372 may include, for example, an oxide.

Figure 22:
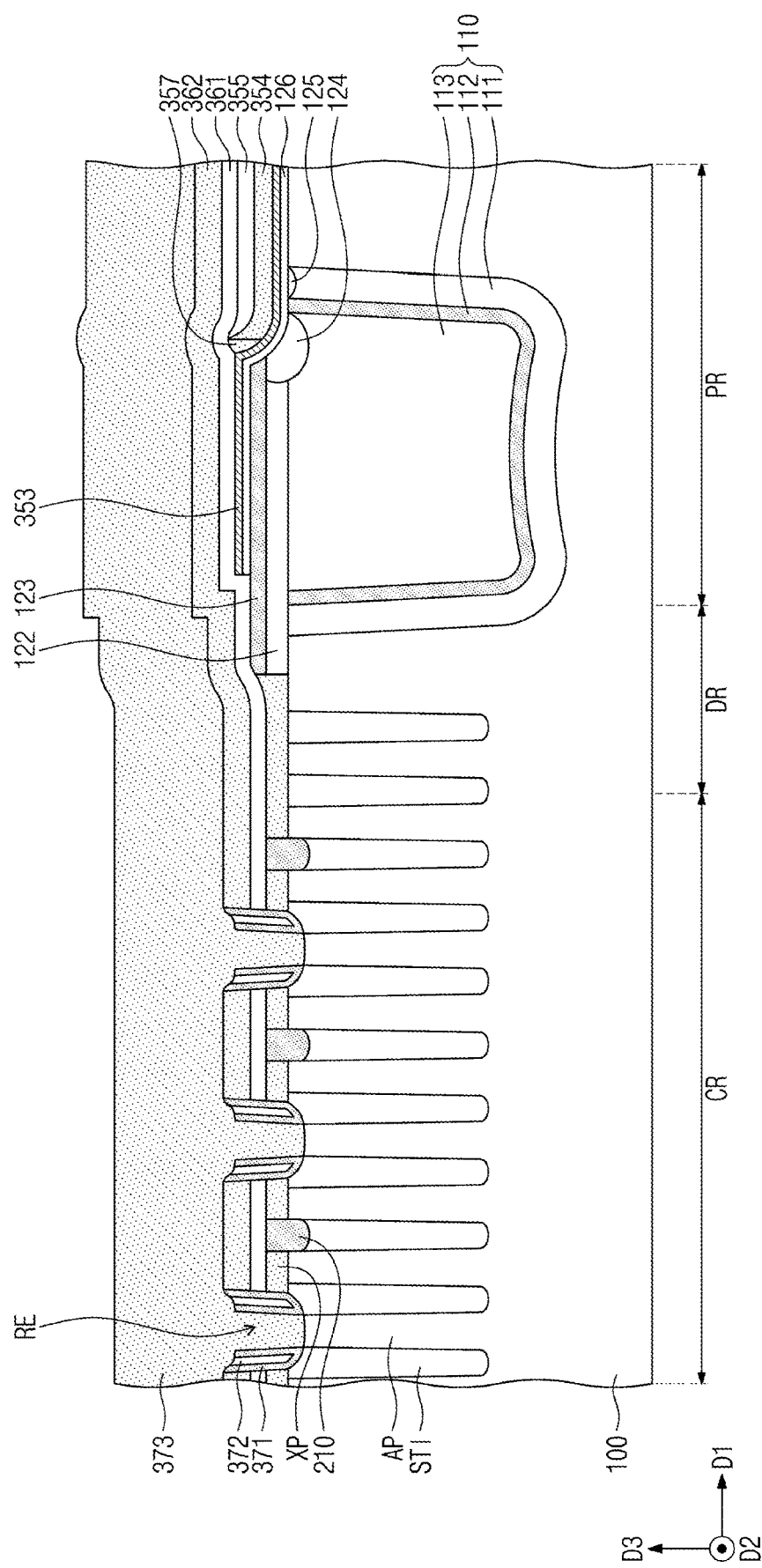

Referring to FIG. 22, a preliminary contact layer 373 may be formed. The preliminary contact layer 373 may fill the recesses RE. The preliminary contact layer 373 may include, for example, polysilicon.

Figure 23:
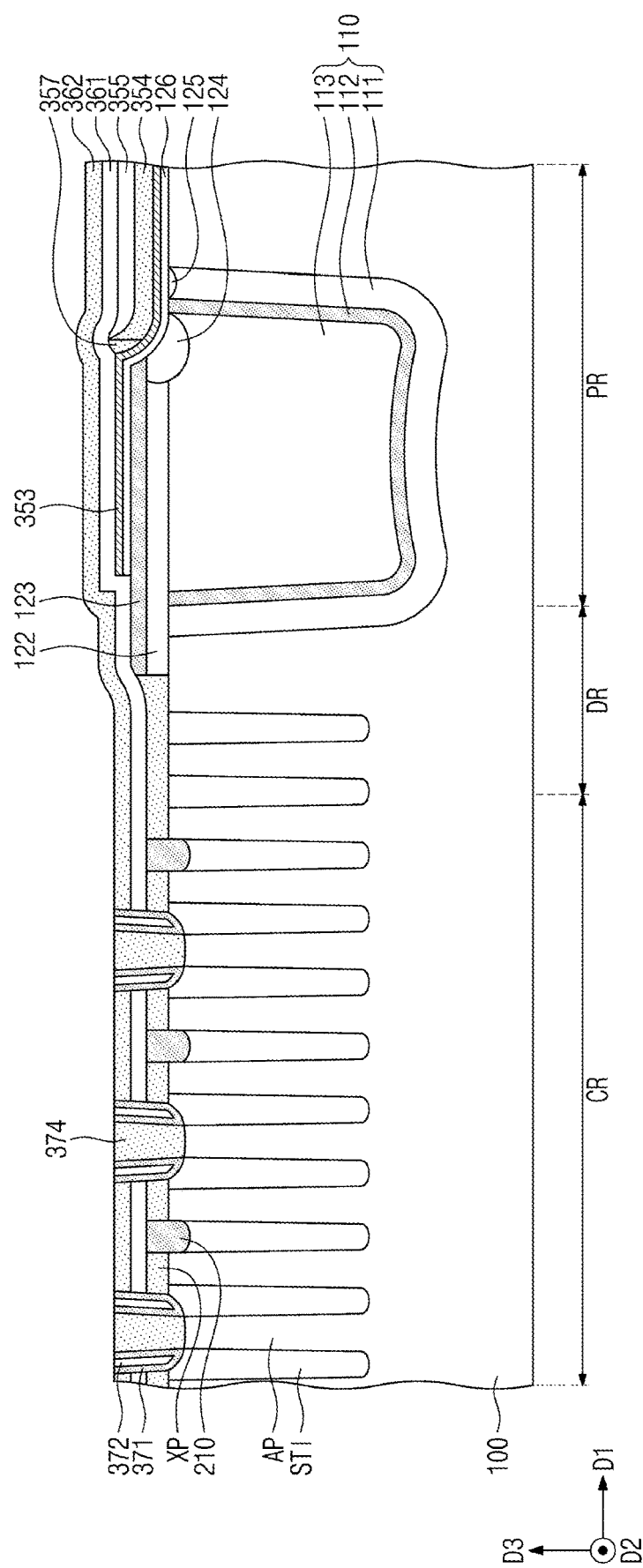

Referring to FIG. 23, the preliminary contact layer 373 may be etched. The etching of the preliminary contact layer 373 may form preliminary contact patterns 374. Each of the preliminary contact patterns 374 may fill the recess RE.

Figure 24:
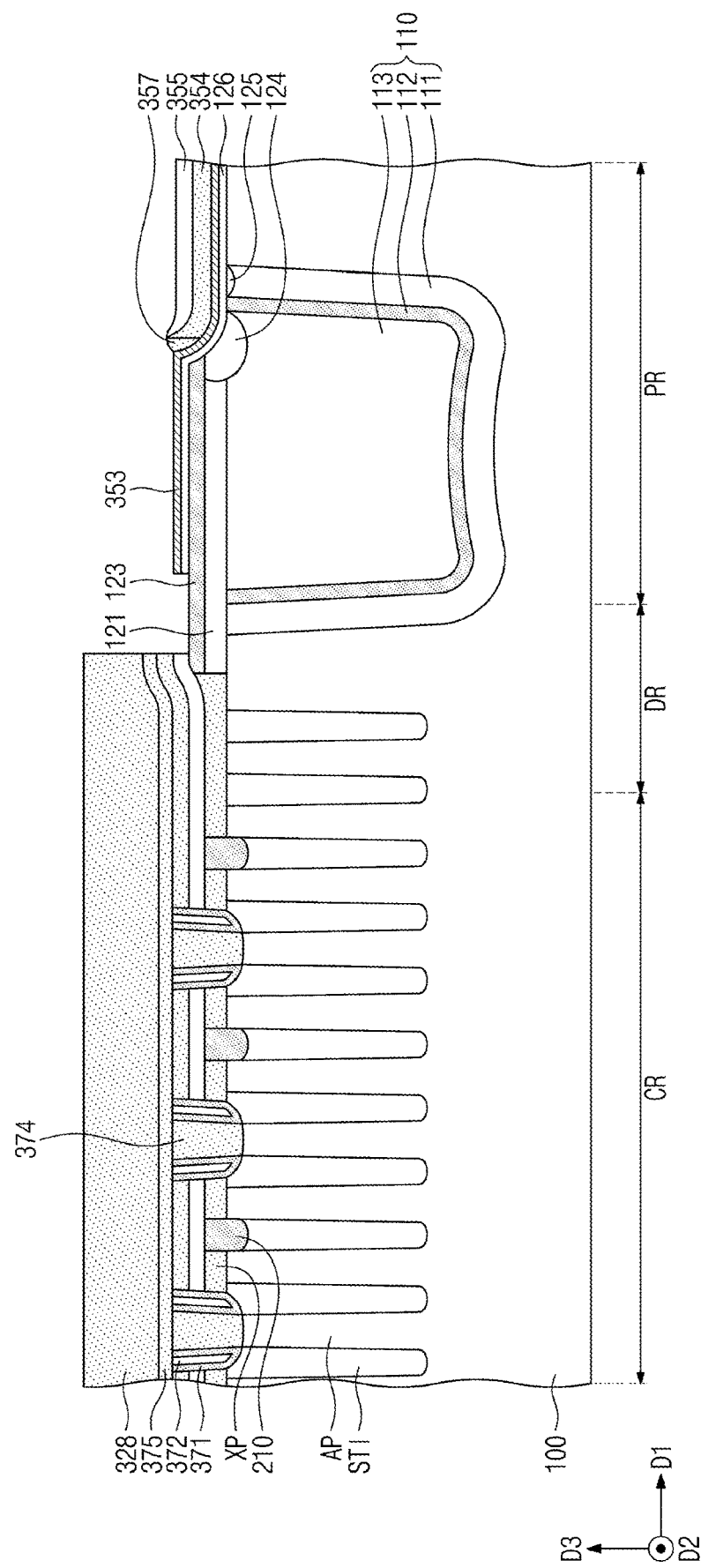

Referring to FIG. 24, a second preliminary conductive layer 375 may be formed. An eighth photoresist pattern 328 may be formed on the second preliminary conductive layer 375. The eighth photoresist pattern 328 may be used as an etching mask to etch the second preliminary conductive layer 375, the first preliminary conductive layer 362, and the preliminary dielectric layer 361. The etched preliminary dielectric layer 361 may be defined as a dielectric pattern 121.

Figure 25:
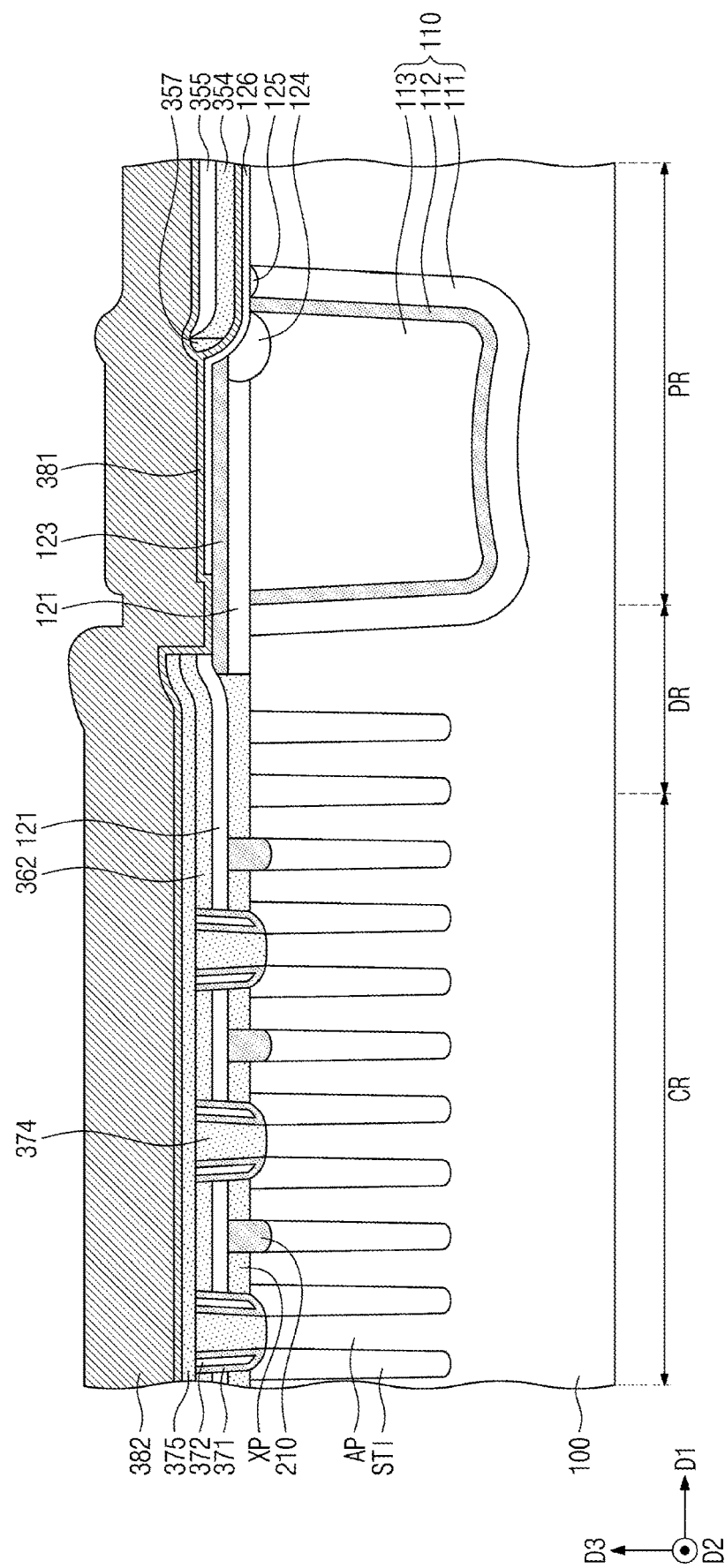

Referring to FIG. 25, a third preliminary conductive layer 381 may be formed on the second preliminary conductive layer 375. A fourth preliminary conductive layer 382 may be formed on the third preliminary conductive layer 381. For example, the third and fourth preliminary conductive layers 381 and 382 may include a metal.

Figure 26:
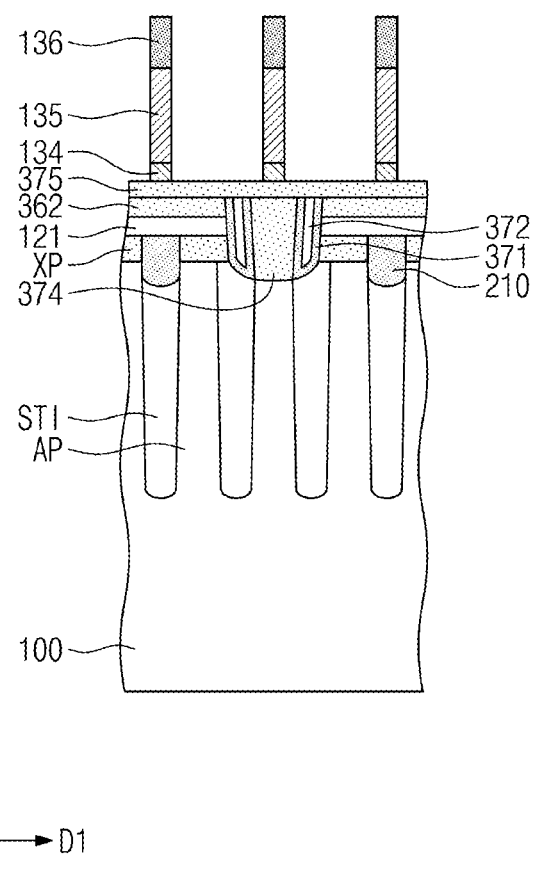

Referring to FIG. 26, a preliminary capping layer may be formed on the fourth preliminary conductive layer 382. An etching action may be applied to the preliminary capping layer, the fourth preliminary conductive layer 382, and the third preliminary conductive layer 381. The preliminary capping layer may be etched to form bit-line capping layers 136. The fourth preliminary conductive layer 382 may be etched to form fourth conductive layers 135. The third preliminary conductive layer 381 may be etched to form third conductive layers 134.

Figure 27:
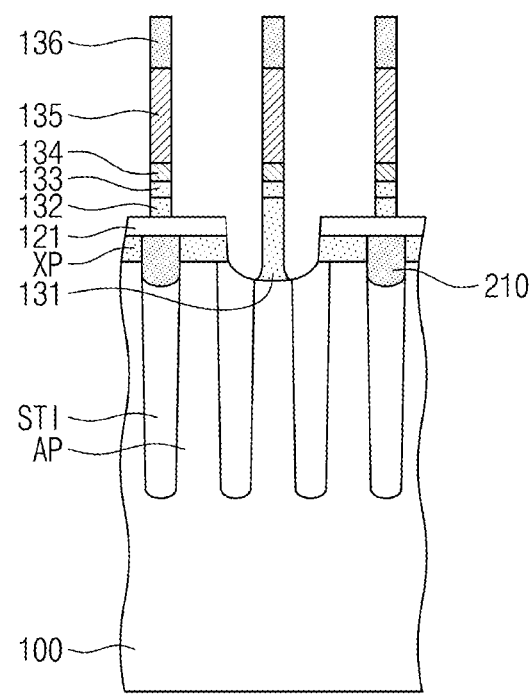
Figure 27:
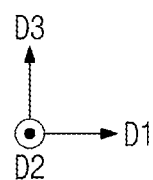

Referring to FIG. 27, an etching action may be applied to the second preliminary conductive layer 375, the first preliminary conductive layer 362, and the preliminary contact patterns 374. The second preliminary conductive layer 375 may be etched to form second conductive layers 134. The first preliminary conductive layer 362 may be etched to form first conductive layers 132. The preliminary contact pattern 374 may be etched to from a bit-line contact 131.

Referring to FIGS. 1B, 1C, 1D, and 1E, a bit-line spacer 137 may be formed, and a bit-line structure 130 may be formed. Similar to the bit-line structure 130, a dummy line structure 140 may be formed.

A buried contact BC, a landing pad LP, a dielectric fence 240, a filling pattern 250, and a data storage pattern DSP may be formed. A fourth dielectric layer 127 may be formed over the peripheral region PR.

In a method of fabricating a semiconductor device according to some embodiments, when the recess RE is formed between the cell separation patterns 210 that are spaced apart from each other, the forming of the recess RE may be less difficult.

Figure 28:
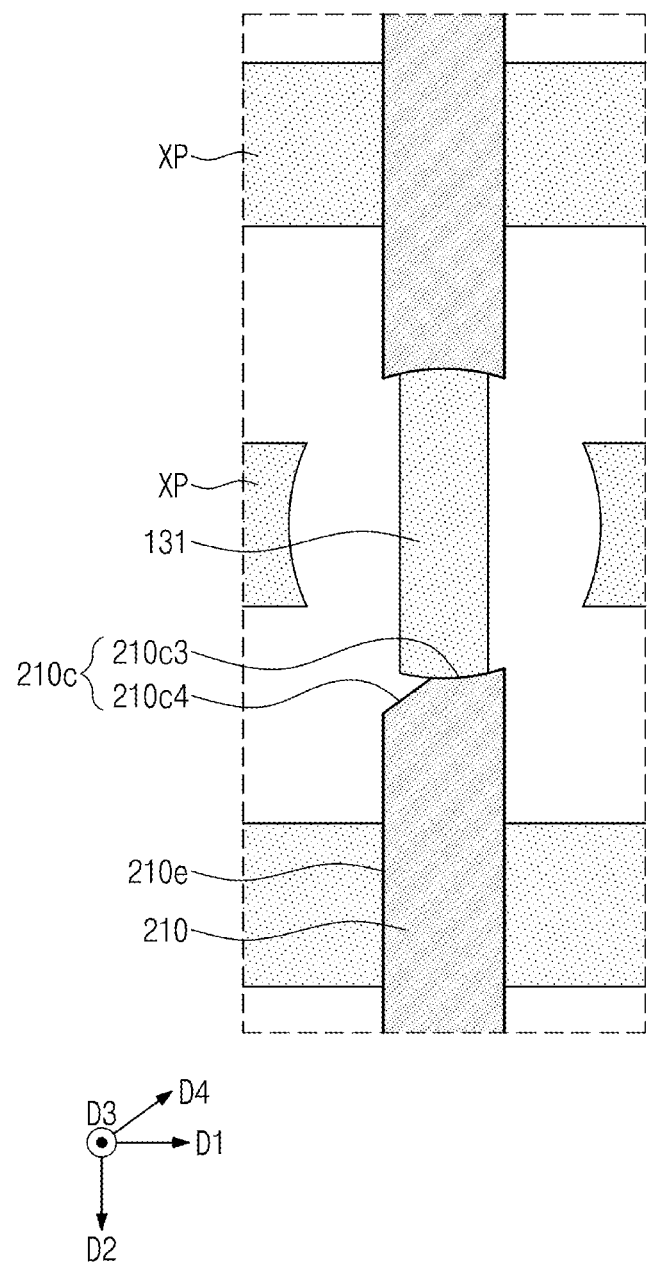
FIG. 28 illustrates a plan view showing a semiconductor device according to some embodiments.

FIG. 28 illustrates a plan view showing a semiconductor device according to some embodiments.

Referring to FIG. 28, the cell separation pattern 210 may include a first sidewall 210e in contact with the connection pattern XP and a second sidewall 210c in contact with the bit-line contact 131.

The second sidewall 210c of the cell separation pattern 210 may include a first portion 210c3 in contact with the bit-line contact 131 and a second portion 210c4 extending away from the bit-line contact 131. The first portion 210c3 of the second sidewall 210c of the cell separation pattern 210 may have a curved upper portion and a flat lower portion. The upper portion of the first portion 210c3 of the second sidewall 210c included in the cell separation pattern 210 may be in contact with the bit-line contact 131, and the lower portion of the first portion 210c3 of the second sidewall 210c included in the cell separation pattern 210 may extend away from the bit-line contact 131. The cell separation pattern 210 may be flat at the second portion 210c4 of the second sidewall 210c. The second portion 210c4 of the second sidewall 210c of the cell separation pattern 210 may be parallel to the fourth direction D4. The first portion 210c3 of the second sidewall 210c of the cell separation pattern 210 may have a lower portion parallel to the fourth direction D4. The lower portion of the first portion 210c3 of the second sidewall 210c included in the cell separation pattern 210 may be coplanar with the second portion 210c4 of the second sidewall 210c of the cell separation pattern 210.

A semiconductor device according to an embodiment may have a relatively large distance between a bit-line contact and a gate electrode, which may result in an improvement in electrical properties of the semiconductor device.

One or more embodiments may provide a semiconductor device with improved electrical properties and increased reliability.

One or more embodiments may provide a semiconductor device including a separation pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a cell active pattern including a first portion and a second portion that are spaced apart from each other;
 a gate structure between the first portion and the second portion of the cell active pattern;
 a bit-line contact on the first portion of the cell active pattern;
 a connection pattern on the second portion of the cell active pattern; and
 a cell separation pattern in contact with the bit-line contact and the connection pattern,
 wherein:
 the cell separation pattern includes a first sidewall in contact with the connection pattern and a second sidewall in contact with the bit-line contact,
 an upper portion of the second sidewall of the cell separation pattern is in contact with the bit-line contact, and
 a lower portion of the second sidewall of the cell separation pattern is spaced apart from the bit-line contact.

2. The semiconductor device as claimed in claim 1, wherein a lowermost portion of the bit-line contact is at a level higher than a level of a lowermost portion of the cell separation pattern.

3. The semiconductor device as claimed in claim 1, wherein:
 the upper portion of the second sidewall of the cell separation pattern is curved, and
 the lower portion of the second sidewall of the cell separation pattern is flat.

4. The semiconductor device as claimed in claim 1, wherein:
 the gate structure extends in a first direction,
 the first sidewall of the cell separation pattern is parallel to a second direction that intersects the first direction, and
 the lower portion of the second sidewall of the cell separation pattern is parallel to a third direction that intersects the first direction and the second direction.

5. The semiconductor device as claimed in claim 1, wherein:
 the gate structure includes a gate dielectric layer, a gate electrode on the gate dielectric layer, and a gate capping layer on the gate electrode, and
 the gate capping layer includes an intervention between the gate dielectric layer and the lower portion of the second sidewall of the cell separation pattern.

6. The semiconductor device as claimed in claim 5, wherein a top surface of the intervention of the gate capping layer is in contact with the bit-line contact.

7. The semiconductor device as claimed in claim 5, wherein the lower portion of the second sidewall of the cell separation pattern is in contact with a sidewall of the intervention of the gate capping layer.

8. The semiconductor device as claimed in claim 1, further comprising a dielectric line on the gate structure, wherein the first sidewall of the cell separation pattern is in contact with the dielectric line.

9. The semiconductor device as claimed in claim 1, further comprising a dummy region and a dummy separation pattern over the dummy region,
wherein the dummy separation pattern includes:
a first sidewall parallel to the first sidewall of the cell separation pattern; and
a second sidewall parallel to the lower portion of the second sidewall of the cell separation pattern.

10. A semiconductor device, comprising:
a cell active pattern including a first portion and a second portion that are spaced apart from each other;
a gate structure between the first portion and the second portion of the cell active pattern;
a bit-line contact on the first portion of the cell active pattern;
a connection pattern on the second portion of the cell active pattern; and
a cell separation pattern in contact with the bit-line contact and the connection pattern,
wherein a lowermost portion of the bit-line contact is at a level higher than a level of a lowermost portion of the cell separation pattern.

11. The semiconductor device as claimed in claim 10, wherein the cell separation pattern includes a first sidewall in contact with the connection pattern and a second sidewall in contact with the bit-line contact.

12. The semiconductor device as claimed in claim 11, wherein:
the second sidewall of the cell separation pattern includes a first portion in contact with the bit-line contact and a second portion spaced apart from the bit-line contact,
an upper portion of the first portion of the second sidewall of the cell separation pattern is curved, and
a lower portion of the first portion of the second sidewall of the cell separation pattern is flat.

13. The semiconductor device as claimed in claim 12, wherein the second portion of the second sidewall included in the cell separation pattern is coplanar with the lower portion of the first portion of the second sidewall included in the cell separation pattern.

14. The semiconductor device as claimed in claim 11, wherein:
an upper portion of the second sidewall of the cell separation pattern is in contact with the bit-line contact, and
a lower portion of the second sidewall of the cell separation pattern is spaced apart from the bit-line contact.

15. The semiconductor device as claimed in claim 14, wherein:
the upper portion of the second sidewall of the cell separation pattern is curved, and the lower portion of the second sidewall of the cell separation pattern is flat.

16. The semiconductor device as claimed in claim 11, wherein:
the gate structure extends in a first direction,
the first sidewall of the cell separation pattern is parallel to a second direction that intersects the first direction, and
a lower portion of the second sidewall of the cell separation pattern is parallel to a third direction that intersects the first direction and the second direction.

17. The semiconductor device as claimed in claim 11, further comprising a dielectric line on the gate structure,
wherein the first sidewall of the cell separation pattern is in contact with the dielectric line.

18. The semiconductor device as claimed in claim 10, wherein an uppermost portion of the first portion of the cell active pattern is at a level higher than the level of the lowermost portion of the cell separation pattern.

19. A semiconductor device, comprising:
a substrate that includes a cell region, a dummy region, and a cell active pattern on the cell region, the cell active pattern including a first portion and a second portion that are spaced apart from each other;
a gate structure between the first portion and the second portion of the cell active pattern;
a bit-line contact on the first portion of the cell active pattern;
a connection pattern on the second portion of the cell active pattern;
a cell separation pattern over the cell region and in contact with the bit-line contact and the connection pattern; and
a dummy separation pattern over the dummy region and spaced apart from the bit-line contact,
wherein:
the cell separation pattern includes a first sidewall in contact with the connection pattern and a second sidewall in contact with the bit-line contact,
the dummy separation pattern includes a first sidewall parallel to the first sidewall of the cell separation pattern and a second sidewall connected to the first sidewall of the dummy separation pattern,
the second sidewall of the cell separation pattern is curved, and
the second sidewall of the dummy separation pattern is flat.

20. The semiconductor device as claimed in claim 19, further comprising a dummy line structure over the dummy region,
wherein the dummy separation pattern is closer than the cell separation pattern to the dummy line structure.

* * * * *